(12) United States Patent
Ghallab et al.

(10) Patent No.: US 7,405,562 B2
(45) Date of Patent: Jul. 29, 2008

(54) MAGNETIC FIELD IMAGING DETECTION APPARATUS

(76) Inventors: Yehya Ghallab, 802 Harris Place NW., Calgary, Alberta (CA) T3B 2V4; Wael Badawy, 150 Edgeview Road NW., Calgary, Alberta (CA) T3A 4V1

( * ) Notice: Subject to any disclaimer, the term of this patent is extended or adjusted under 35 U.S.C. 154(b) by 545 days.

(21) Appl. No.: 10/896,867

(22) Filed: Jul. 23, 2004

(65) Prior Publication Data

US 2006/0017123 A1    Jan. 26, 2006

(51) Int. Cl.
*H01L 29/82* (2006.01)
(52) U.S. Cl. .................. 324/261; 324/228; 257/421; 257/E29.323
(58) Field of Classification Search ............... 324/200, 324/204, 228, 250, 260, 261, 263; 365/158; 257/421, E29.323

See application file for complete search history.

(56) References Cited

U.S. PATENT DOCUMENTS

| 3,944,917 | A  | 3/1976  | Hogg et al.      |
|-----------|----|---------|------------------|
| 4,420,720 | A  | 12/1983 | Newton et al.    |
| 6,169,394 | B1 | 1/2001  | Frazier et al.   |
| 6,191,593 | B1 | 2/2001  | Tartagni et al.  |
| 6,437,551 | B1 | 8/2002  | Krulevitch et al.|
| 6,703,819 | B2 | 3/2004  | Gascoyne et al.  |
| 2003/0010636 | A1 | 1/2003 | Birkbeck et al.  |
| 2004/0053211 | A1 | 3/2004 | Gradl et al.     |

FOREIGN PATENT DOCUMENTS

EP  0993600 B1  3/2004
EP  1154856 B1  5/2004

OTHER PUBLICATIONS

Manaresi et al.; A CMOS chip for individual cell manipulation and detection; IEEE Journal of Solid-State Circuits; vol. 38, Issue 12; Dec. 2003; pp. 2297-2305.*

P.T. Gaynor, P.S. Bodger, "Electrofusion processes: theoretical evaluation of high electric field effects on cellular transmembrane potentials", IEE Proceedings—Science, Measurement, and Technology, vol. 142, No. 2, pp. 176-182, 1995.

G. Medoro, N. Manaresi, M. Tartagni, R. Guerrieri, "CMOS-only Sensors and Manipulation for Microorganisms", Proc. IEDM, pp. 415-418, 2000.

G. Medoro, N. Manaresi, A. Leonardi, L. Altomare, M Tartagni, R. Guerrieri, "A Lab-on-a-Chip for Cell Detection and Manipulation", Proc. of IEEE Sensors 2002, vol. 1, pp. 472-475, 2002.

(Continued)

*Primary Examiner*—Marcos Pizarro
(74) *Attorney, Agent, or Firm*—Anthony R. Lambert

(57) ABSTRACT

A detection apparatus for detecting the presence of a sample, the detection apparatus comprising a chamber, ports for introducing a sample within the chamber, an actuation unit for establishing a controllable electromagnetic field in the chamber; and a sensing unit for sensing changes in the electromagnetic field due to the presence of the sample within the chamber. The sensing unit comprises a sensor device comprising a source and a drain embedded in a FET a gate for the FET, in which the gate is formed of a material whose conductivity is related to the electromagnetic field established in a nonconductive medium in contact with the gate.

28 Claims, 22 Drawing Sheets

OTHER PUBLICATIONS

G. Medoro, N. Manaresi, A. Leonardi, L. Altomare, M Tartagni, R. Guerrieri, "A Lab-on-a-Chip for Cell Detection and Manipulation", IEEE Sensors Journal, vol. 3, No. 3. pp. 317-325, 2003.

N. Manaresi, A. Romani, G. Medoro, L. Altomare, A. Leonardi, M. Tartagni, R. Guerrieri, "A CMOS Chip for Individual Manipulation and Detection", IEEE International Solid-State Circuits Conference, ISSCC 03, pp. 486-488, 2003.

Y.H. Ghallab, W. Badawy, K.V.I.S. Kaler, "A Novel pH Sensor Using Differential ISFET Current Mode Read-out Circuit", ICMENS '03, pp. 255-258, 2003.

Y.H. Ghallab, W. Badawy, "Sensing Methods of Dielectrophoresis Phenomenon: From Bulky Instruments to Lab-on-a-Chip", IEEE Circuits and Systems, vol. 4, No. 3, pp. 5-15, Third Quarter, 2004.

Y.H. Ghallab, W. Badawy, "A Novel CMOS Lab-on-a-Chip for Biomedical Applications", 2005 IEEE International Symposium on Circuits and Systems (ISCAS), 4 pages, Kobe, Japan, May 2005.

A. Khan, M. A. Al-Turaigi, M. Abou El-Ela, "Operational Floating Current Conveyor: Characteristics, Modeling, and Applications", IMTC '94, Hamamatsu, Japan, May 10-12, 1994, pp. 788-790.

Y.H. Ghallab, M. Abou El-Ela, M. Elsaid, "A novel universal voltage-mode filter with three inputs and single output using only two Operational Floating Current Conveyor", ICM '00, Tehran, Oct. 31-Nov. 2, 2000, pp. 95-98.

Analog Devices manual, "450 V/ s, Precision, Current-Feedback Op Amp (AD846), REV. B", Oct. 1988, pp. 1-12.

Intersil Corporation, "CA3096, CA3096A, CA3096C: NPN/PNP Transistor Arrays", File No. 595.4, Dec. 1997, pp. 1-14.

A.A. Khan, M. A. Al-Turaigi, M. Abou El-Ela, "An Improved Current-Mode Instrumentation Amplifier with Bandwidth Independent of Gain", IEEE Trans. Instr. Meas., vol. 44, No. 4, Aug. 1995, pp. 887-891.

B. Wilson, "Universal Conveyor Instrumentation Amplifier", Elect. Let., vol. 25, No. 7, Mar. 1989, pp. 470-471.

S.J.G. Gift, "An Enhanced Current-Mode Instrumentation Amplifier", IEEE Trans. Instr. Meas., vol. 50, No. 1, Feb. 2001, pp. 85-88.

Y.H. Ghallab, W. Badawy, K. V.I.S. Kaler, B.J. Maundy, "A Novel Current-Mode Instrumentation Amplifier Based on Operational Floating Current Conveyor", submitted to IEEE Transactions on Instrumentation and Measurement, Jan. 2003, published in IEEE Transactions On Instrumentation and Measurement, vol. 54, No. 5, Oct. 2005, pp. 1941-1949.

* cited by examiner

MAGNETIC FIELD IMAGING DETECTION APPARATUS

BACKGROUND OF THE INVENTION

The behavior of matter in electrical or magnetic field, especially nonuniform fields, is of interest to scientists of various branches: Physics, chemistry, engineering, or life sciences. To chemists and physicists, it's a science of many and varied phenomena. To engineers, it's a source of new and useful techniques for separating, levitating, and rotating materials or improving material behavior.

In recent decades, Dielectrophoresis has become a fairly well known phenomenon in which a spatially nonuniform electric field exerts a net force on the field-induced dipole of a particle. Particles with higher polarizability than the surrounding medium experience positive dielectrophoresis and they move toward regions of highest electric field concentration. Particles less polarizable than the surrounding medium experience negative dielectrophoresis, and move towards regions of low electric field concentration. The force depends on the induced dipole and the electric field gradient, not on the particle's charge. Thus, dielectrophoresis has been used to precipitate DNA and proteins, to manipulate viruses (100 nm diameter), and to manipulate and separate cells and subcellular components such as microtubules.

Dielectrophoretic levitation fulfills a somewhat specialized need among the scientific and technical applications for dielectrophoresis. Two types of levitation, passive and feedback-controlled may be used to levitate particles exhibiting, respectively, negative and positive DEP behavior.

DEP is technologically important in its own right, as evidenced by the number of applications in such scientific and technical fields as biophysics, bioengineering, and mineral separation. As an example, which is important in cancer treatment, is cell fusion, as discussed by P. T. Gaynor, and P. S. Bodger in "Electrofusion processes: theoretical evaluation of high electric field effects on cellular transmembrane potentials", *IEE Proceedings-Science, Measurement and Technology,* vol. 142, no. 2, pp. 176-182, 1995. In this process, the nonuniform electric field collects some fraction of these cells on electrode surfaces where cells of the two types inevitably encounter each other and form chains. A serious of short DC pulse is then applied to the electrodes. The strong DC field disturbs the membranes in the region of contact between cells and initiates their merge or fusion. A potential application of this technique is the production of antibodies useful in cancer research and treatment.

Lab-on-a-chip based on DEP phenomenon has become one of the hottest areas of research recently. It has many applications in the biological, pharmaceutical, medical, and environmental fields. These applications are characterized by complex experimental protocols, which need both microorganism detection and manipulation. Hence, lab-on-a-chip technology needs to integrate functions such as: actuation, sensing, and processing to increase their effectiveness. On the other hand, lab-on-a-chip technology holds the promise of cheaper, better and faster biological analysis. However, to date there is still an unmet need for lab-on-a-chip technology to effectively deal with the biological systems at the cell level.

Recently, two different lab-on-a-chip approaches have been proposed by G. Medoro, N. Manaresi, M. Tartagni, and R. Guerrieri, in "CMOS-only Sensors and Manipulation for microorganisms", Proc. IEDM, pp. 415-418, 2000 and by N. Manaresi, A. Romani, G. Medoro, L. Altomare, A. Leonardi, M. Tartagni, and R. Guerrieri in "A CMOC Chip for Individual Manipulation and Detection", *IEEE International Solid-State Circuits Conference,* ISSCC 03, pp. 486-488. 2003. The first, which was proposed in 2002, is the first lab-on-a-chip approach for electronic manipulation and detection of microorganisms. The proposed approach combines dielectrophoresis with impedance measurements to trap and move particles while monitoring their location and quantity in the device. The prototype has been realized using standard printed circuit board (PCB) technology. The sensing part in this approach can be performed by any electrode by switching from the electrical stimulus to a transimpedance amplifier, while all the other electrodes are connected to ground. The second lab-on-a-chip, which was proposed in 2003, is a microsystem for cell manipulation and detection based on standard 0.35 μm CMOS technology. This lab-on-a-chip microsystem comprises two main units: the actuation unit, and the sensing unit. The chip surface implements a 2D array of microsites, each comprising superficial electrodes and embedded photodiode sensors and logic. The actuation part is based on the DEP technique. The sensing part depends on the fact that particles in the sample can be detected by the changes in optical radiation impinging on the photodiode associated with each micro-site. During the sensing, the actuation voltages are halted, to avoid coupling with the pixel readout. However, due to inertia, the cells keep their position in the liquid.

The disadvantage of these lab-on-a-chip microsystems, can be summarized as follows:

Based on these two systems, we can detect the position of the levitated cells. However, we cannot sense the actual intensity of the nonuniform electric field that produces the DEP force.

The measurements here are indirect. In other words, there is no "real-time" detection of the cell response under the effect of the nonuniform electric field, as the actuation part is halted while the sensing part is activated.

The sensing part in these two microsystems depends on the inertia of the levitated cells. In other words, this sensing approach depends on an external factor, which is the inertia of the levitated cells. Thus, only cells with higher inertia can be sensed and detected by using these two microsystems.

What is needed is a lab-on-a-chip that can be used for direct measurements, where the variations in the electric field can be sensed and the cell can be characterized while the actuation part is still active.

SUMMARY OF THE INVENTION

There is therefore provided, according to an aspect of the invention, a sensor device, comprising a source and a drain embedded in a FET; and a gate for the FET, in which the gate is formed of a material whose conductivity is sensitive to an electric, magnetic or electromagnetic field established in a nonconductive medium in contact with the gate. The field may be non-uniform. The FET may comprise two spatially separated gates and two spatially separated drains, with a common source. Two sensor devices may be connected, where wherein the FET of the first sensor device is a p-type FET and the FET of the second sensor device is a n-type FET. The sensor device may be connected in an array of sensor devices.

According to a further aspect of the invention, there is provided a detection apparatus, the detection apparatus comprising a chamber; a port or ports for introducing a sample into the chamber; an actuation unit for establishing a controllable electromagnetic field in the chamber; and a FET sensing unit for sensing changes in the electromagnetic field due to the presence of the sample within the chamber. The FET sensing unit may be comprised of sensor devices described above. The changes in the electromagnetic field sensed by the sensing unit may be used to determine the impedance of the sample, or a characterization unit may use the changes sensed by the sensor unit to make a 2D image of the electromagnetic field. The actuation unit may be responsive to feedback from the sensor device. The actuation unit may comprise an array of electrodes, for example in a quadrupole arrangement, and the sensing unit may comprise an array of sensors interspersed with the array of electrodes. At least one of the electrodes and sensors may receive power from an electromagnetic source, wherein the electromagnetic energy is directed by mirrors controlled by the actuation unit, or from a power source controlled by the actuation unit. The electrodes may be elongate members, the elongate members receiving power at one end and generating the electromagnetic field at the other end in response to the power.

According to a further aspect of the invention, there is provided a method of detecting a sample using dielectrophoresis, using the sensor device and detection apparatus described, where the electromagnetic field is generated and the changes in the electromagnetic field are sensed simultaneously. The particle may be organic matter or a cell.

Other aspects of the invention will be found in the detailed description and claims that follow.

BRIEF DESCRIPTION OF THE DRAWINGS

There will now be given a detailed description of preferred embodiments of the invention, with reference to the drawings, by way of illustration only and not limiting the scope of the invention, in which like numerals refer to like elements, and in which.

DETAILED DESCRIPTION OF THE PREFERRED EMBODIMENTS

Figure 1A:
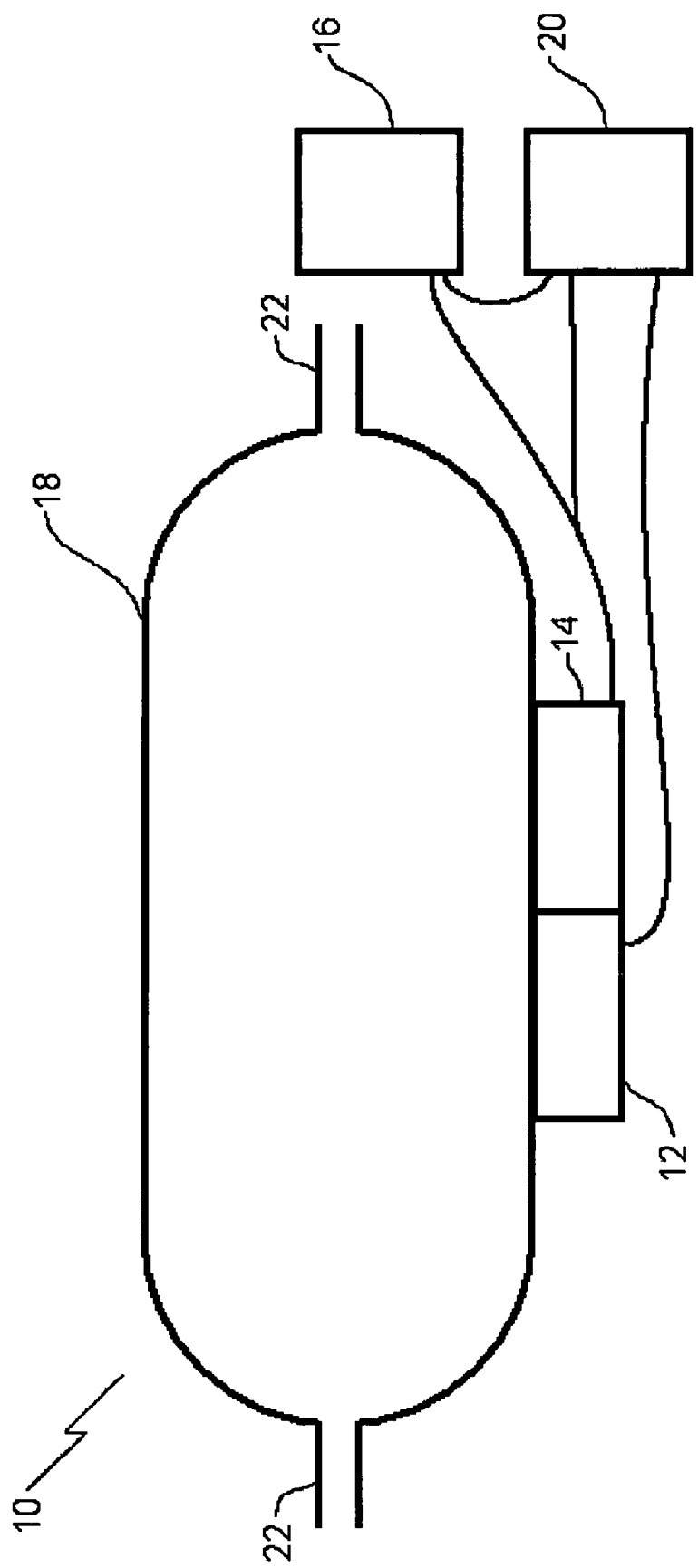
FIG. 1a is a block diagram of an apparatus constructed in accordance with the teachings of the present invention.
Figure 1B:
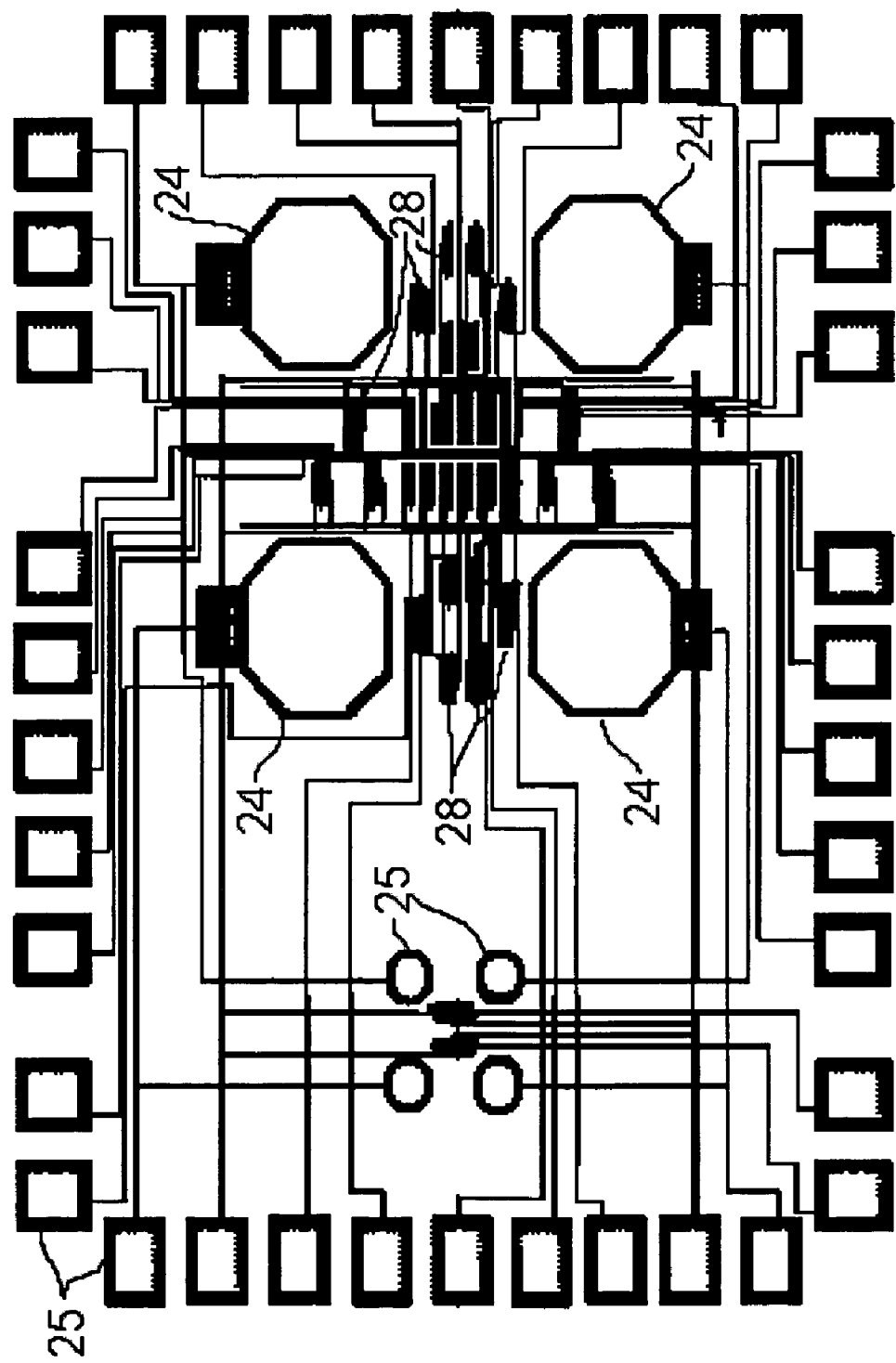
FIG. 1b is a schematic view of actuation and sensing units used in an embodiment of the invention.

The electric field imager disclosed herein is based on conventional TSMC 0.18 μm CMOS technology. Some simulation and experimental results are presented at the end of the disclosure. Referring now to FIG. 1a, the proposed microsystem 10 comprises (a) an actuation unit 12, which is in a quadruple electrode configuration as shown in FIG. 1b to produce the required DEP force to levitate the sample, for example, a cell, that we want to characterize; (b) a sensing unit 14, which is a Differential Electric Field Sensitive Field Effect Transistor (DeFET), where, to obtain an image of the electric field, and characterize the levitated cell, the DeFET is used in an array form, and the read out circuit [i.e. the electric field-to-voltage converter (E-to-V converter) circuit] is on a chip; (c) a characterization unit 16 to analyze the images and determine characteristics of the sample; (d) a chamber 18 to hold the sample with ports for inserting the sample; and (e) a controller 20 for controlling the actuation unit 12. The controller 20 may be programmed to create a specific non-uniform field, and may operate based upon feedback from the sensing unit 14 or the characterization unit 16. Each component may be located in any convenient location, such as under, inside or outside the chamber. Also, while the actuation unit 12 and sensing unit 14 are shown as separate bodies, it will be understood that they may occupy the same space as shown in FIG. 1b. The chamber 18 has ports 22 for introducing a sample. As described, the apparatus 10 is capable of simultaneously actuating, sensing, and manipulating the sample in the chamber 18, and can be used to process samples such as cells, particles, liquids, powder, organic matter, bio-live or dead species, or other types of samples. In this document, processing a sample includes, but is not limited to, actuating, sensing, testing, levitating, separating, manipulating, isolating, trapping, analyzing, or identifying the sample as a whole or a part thereof, performed individually, or in combination. It will also be understood that when an electric field is referred to, the discussion may equally apply to magnetic fields, or electromagnetic field, since a time varying electric field will have a magnetic field component. Each of the components presented above will now be discussed in more detail.

The Actuation Unit

Figure 2:
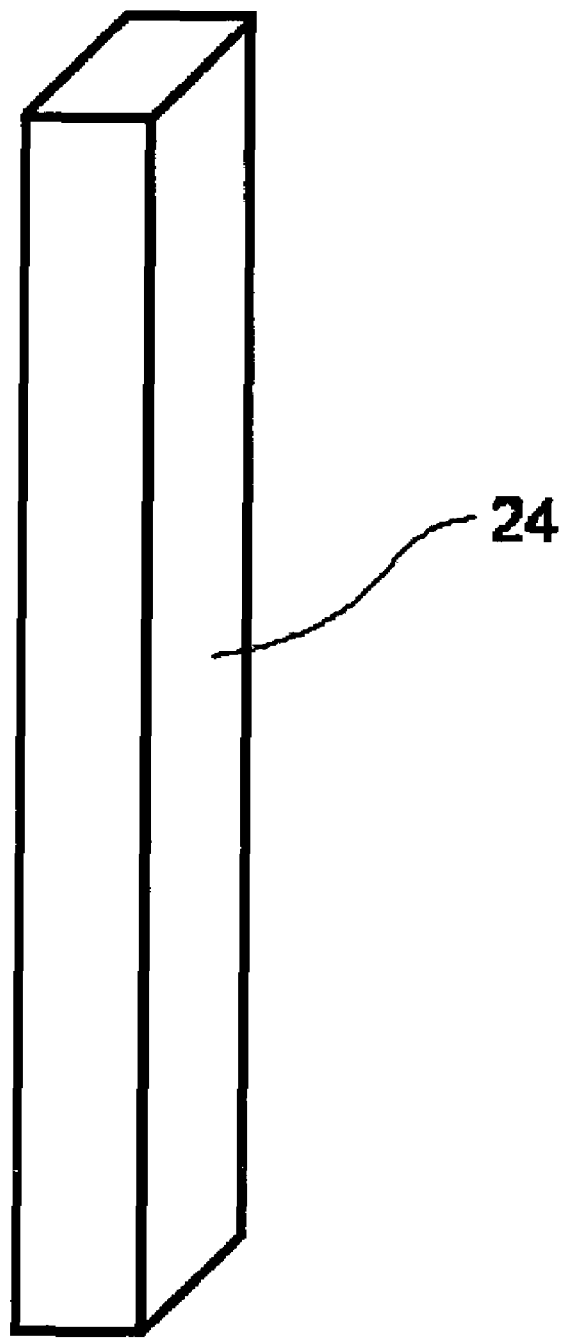
FIG. 2 shows light-based electrodes used in the actuation unit.
Figure 3:
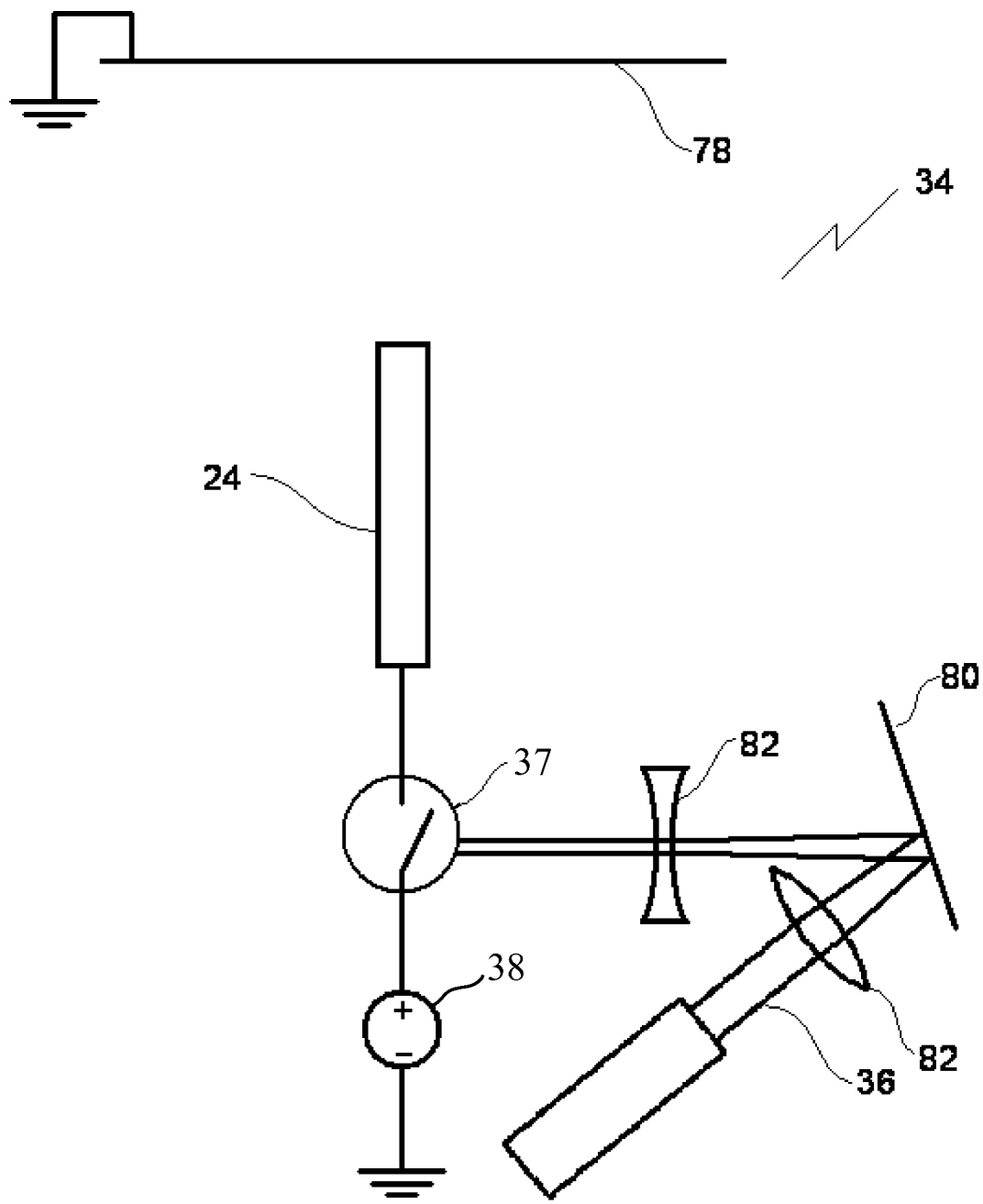
FIG. 3 shows light beam controlled driving circuits for the electrodes in the actuation unit.
Figure 4:
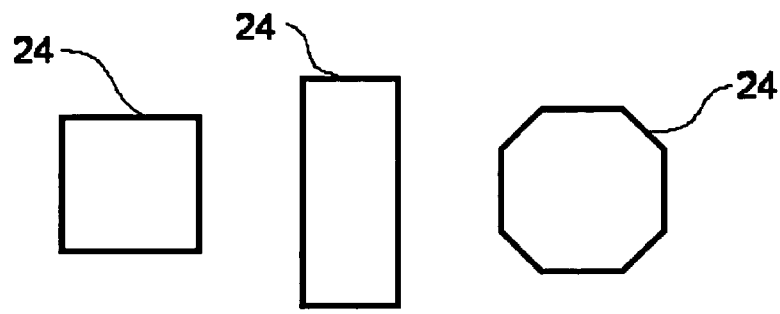
FIG. 4 shows various shapes of the tip of the electrode.
Figure 11A:
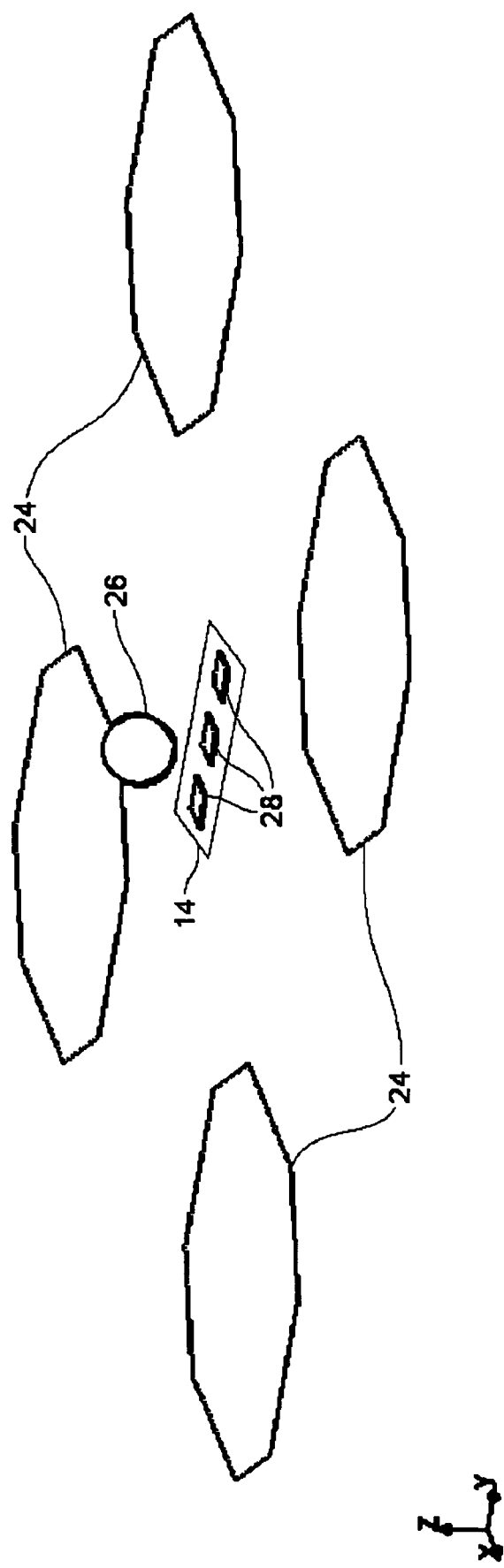
FIG. 11a is a perspective view of a representation of the quadrupole and DeFET.

The actuation unit 12 comprises poles 24, or electrodes, that generate the electric field in the chamber 18. The poles 24 are spatially distributed as shown in FIG. 1b and produce the required force to process a sample (not shown). Sensors 28 are also spatially distributed. Each pole 24 and sensor 28 is connected to a corresponding terminal 25 to allow them to be individually addressed. Referring to FIG. 11a, the sample 26 is shown in the center of four poles 24 with sensors 28 below. Referring again to FIG. 1b, each pole 24 can be individually addressed and actuated using electrical signals, a light beam such as a laser, or other sources of energy, such as a magnetic source connected to terminals 25 to produce the desired field and therefore operate on the sample 26. In the case of the laser, the light beam will use a set of mirrors and lenses to focus the beam on the ele2ctrode to be actuated. FIG. 2 shows the light-based electrodes 24 and FIG. 3 shows the driving circuits 34 where the light beam 36 controls a switch 37 that adjusts the voltage at the top of the pole 24, which in turn affects the electric field and corresponding DEP force that is generated between the pole 24 and the grounded plate 78 on the other side. Mirror 80 and lenses 82 are shown directing the beam 36. The arrangement used may be a much more complex system, where the position of mirrors 80 and lenses 82 are controlled to address individual poles 24. The cross-section of the tip of pole 24, where the force is generated, can be hexagonal, square, rectangular, or other shapes, with examples shown in FIG. 4. Each pole 24 may be programmed to adjust its value based on the readout of the sensing unit 14 to create a feedback loop that can verify the exact value of the generated force.

Figure 3A:
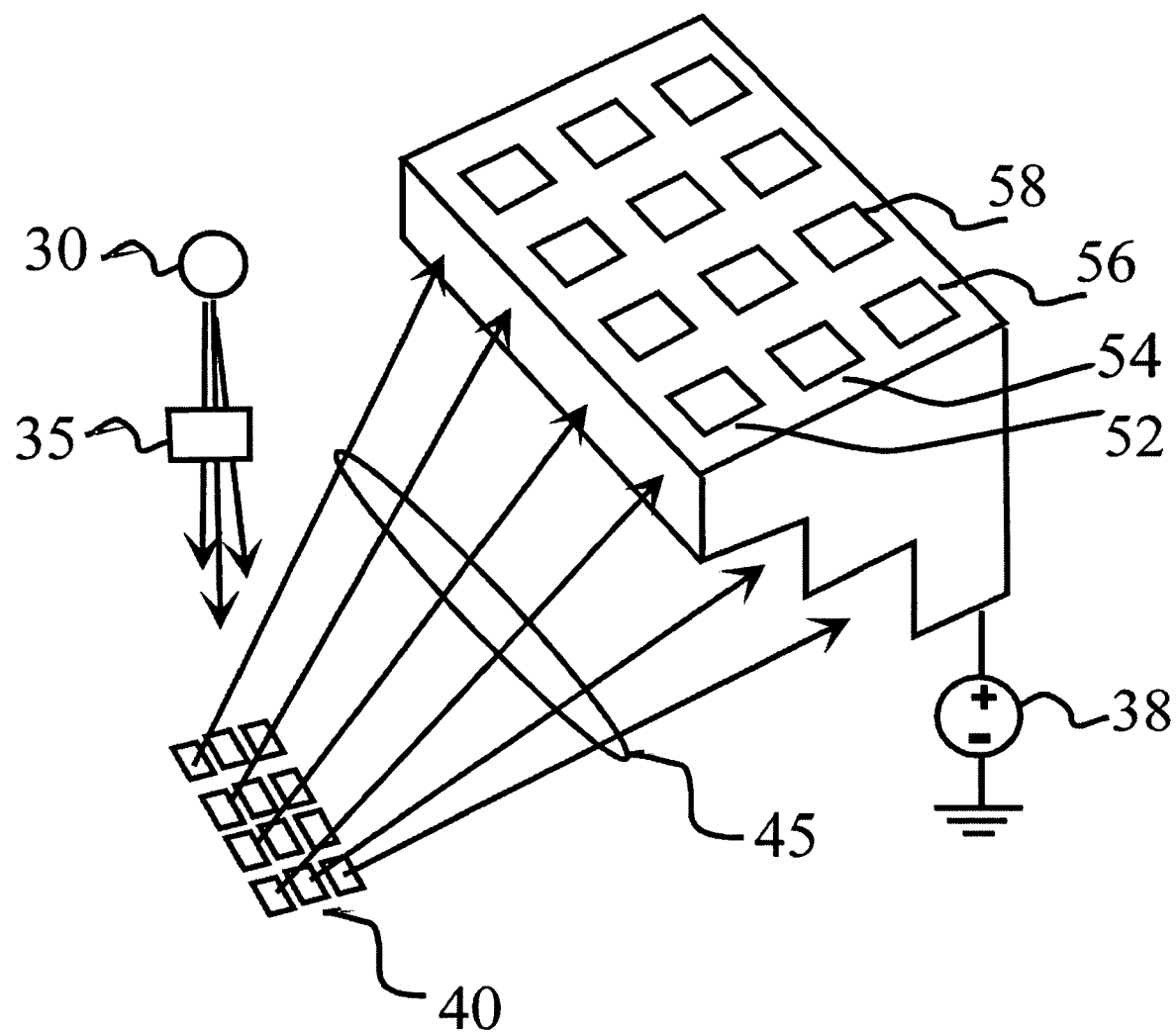
FIG. 3a shows light beam controlled driving circuits for an array of electrodes in the actuation unit.

FIG. 3a shows the spatial distributed poles to generate an arbitrary electric field by controlling the values of the volt at the individual electrodes. The poles 52, 54, 56, and 58 are similar to the configuration in FIG. 3 but with different height to enable single addressable poles. The pole 52 that is closer to the light source is shorter than the far poles (54 and 56) in the other raw. The poles in the same row 56 have the same height to simplify the addressing mechanism. A light or energy source 30 is used to control the volt at the pole. The energy will be modulated using a modulator 35. A micromirror array 40 is used to direct the energy to a switch 38 in FIG. 3. Each micro-mirror is separately controlled or programmable to reflect the light or the energy to a specific pole. The energy beams 45 reflected from the mirror and falling on the switch at each pole will control the voltage (driven from the voltage source 38) at the electrode tip. The actuation pole can be various shapes and concentric as shown in FIG. 11e. Each electrode should have a metallic tip.

Figure 11B:
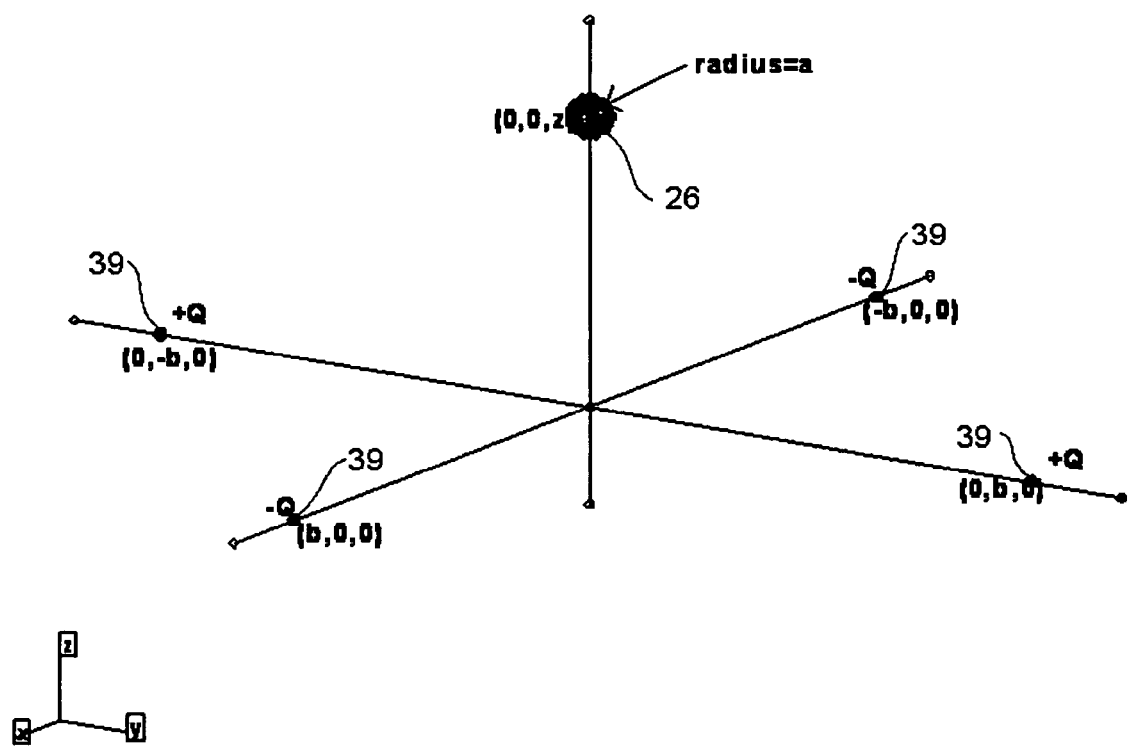
FIG. 11b is a point charge representation of the quadrupole arrangement.

Referring now to FIG. 11b, the actuation poles 24 in the quadrupole configuration shown in FIG. 11a are approximated by a system of four point charges 39 (±Q) located in the x-y plane and arranged symmetrically about the z-axis. Due to symmetry, the radial component of the force is zero (i.e. $F_\rho=0$), and the z-component of the DEP force is defined by the following equation:

$$\frac{F_z}{a^5} \cong -\frac{3Q^2}{\pi\varepsilon_1}\text{Re}[K_2]\frac{(z/b)}{b^7(1+(z/b)^2)^6} = -\frac{3Q^2}{\pi\varepsilon_1}\text{Re}[K_2]G_{QUAD}(z)$$

where $G_{QUAD}(z)$ collects the geometric dependencies and $$K_2 = \frac{10(\varepsilon_p^* - \varepsilon_m^*)}{2\varepsilon_p^* + 3\varepsilon_m^*}$$

where $\in^*_p$ is the complex permittivity of the cell with radius a immersed in a media with complex permittivity $\in^*_m$. From the first equation, we can observe that the force $F_z$ is proportional to $a^5$ (radius)$^5$, so we can levitate the small particles using this configuration. On the other hand, the quadrupole levitator comprises an azimuthally symmetric electrode arrangement capable of sustaining passive stable particle levitation. Also, as a diagnostic tool, quadrupole levitation offers researchers insight into the detailed electrical composition of materials. For these reasons, we selected the quadrupole electrode configuration as an actuation part in our design. It will be apparent to those skilled in the art that other designs may also be used.

Figure 11C:
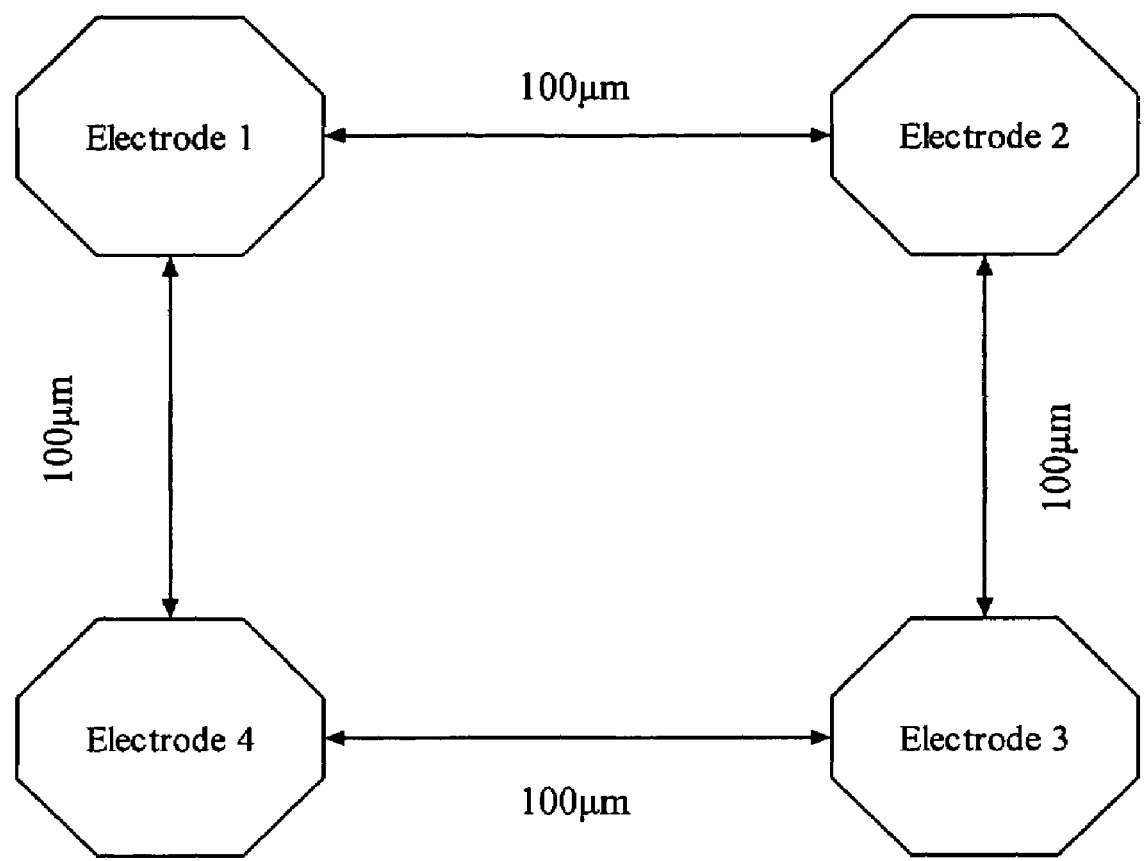
FIG. 11c shows a large quadrupole configuration of electrodes.
Figure 11D:
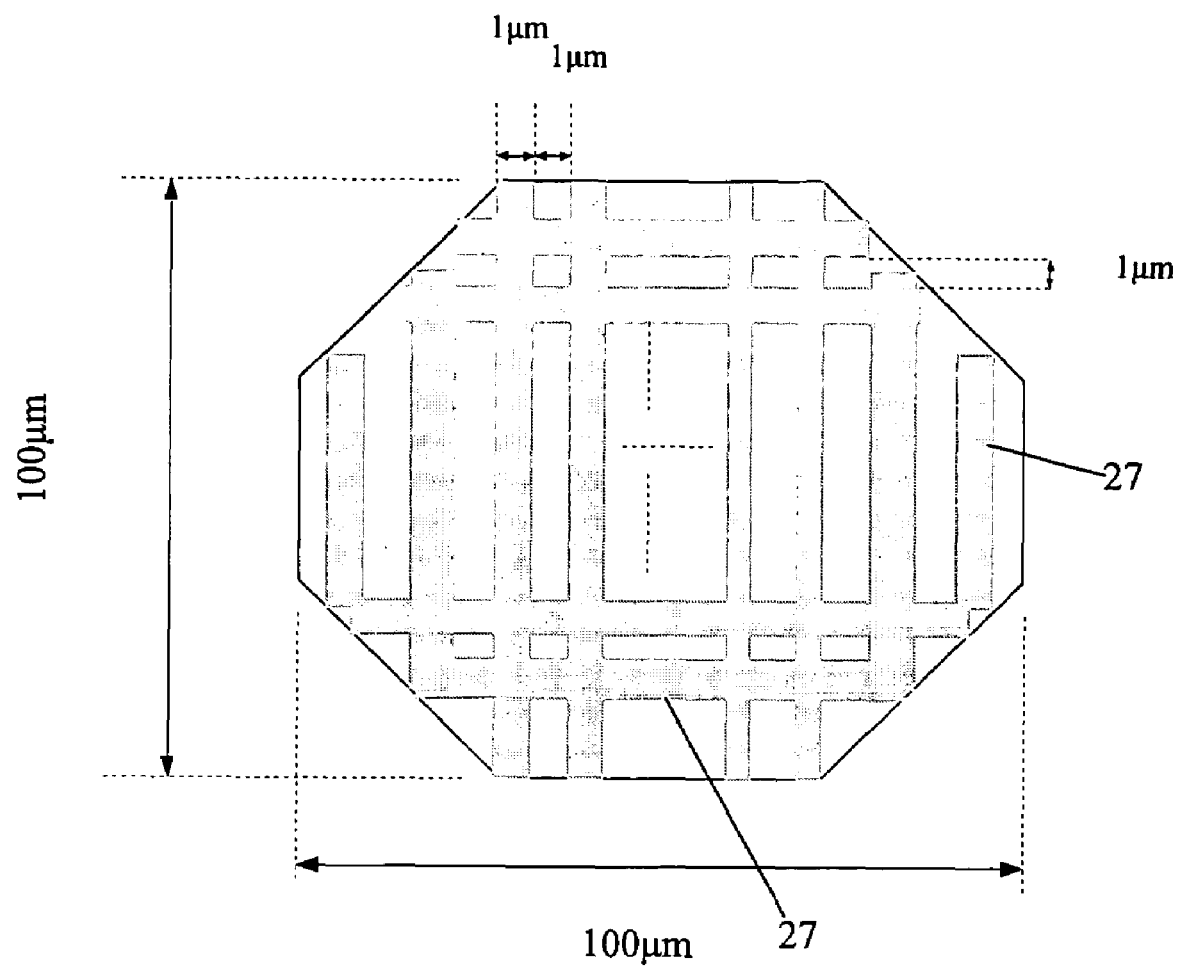
FIG. 11d is a schematic of a single large quadrupole electrode using metal2 stips.
Figure 11E:
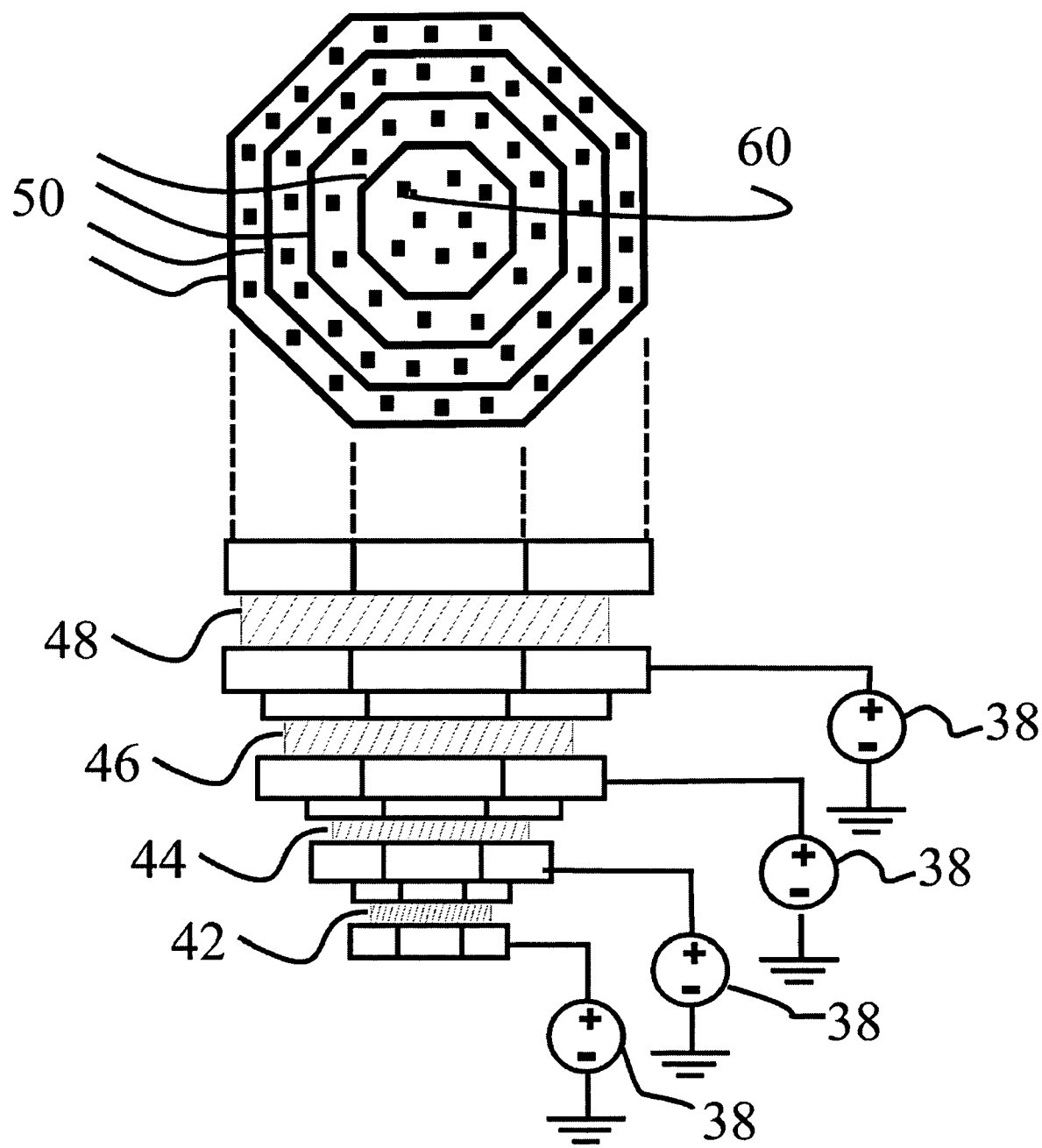
FIG. 11e shows a centric configuration for light beam controlled driving poles with the sensor.

To implement a large (100 μm) quadrupole system in the 0.18 CMOS technology, we are using four identical octagons using metal2 layer. These octagons are in the x-y plane and arranged symmetrically about the z-axis (see FIG. 11a), with a distance 100 μm between each other, as shown in FIG. 11c. FIG. 11d shows a schematic diagram of a single electrode. The dimension of the electrode is 100 μm×100 μm from edge to edge. This dimension violates the direct rule check (DRC) of the standard 0.18 μm technology, for which the maximum metal area should be <35 μm×35 μm. Thus, we used a grid or mesh arrangement of metal2 that leaves a 1 μm space between each metal2 rectangle, as shown in FIG. 11d. Individual strips 27 of metal2 overlap each other and are spaced with gaps between them to form a mesh electrode. FIG. 11e shows a concentric continuous pole 50 with embedded sensors 60. The poles have different heights. The inner pole has light sensitive switch 42, the outside pole has switch 48 and the in-between two poles have the switches 44 and 46. The poles are connected to a voltage source 38. The shape in FIG. 11e is octagonal because it is easier to fabricate in 0.18 μm standard TSMC technology, but any other shape can be used. It is worth noted that the continuity of the electrodes generate a better and more accurate planar electric field.

The Sensing Unit

Figure 8:
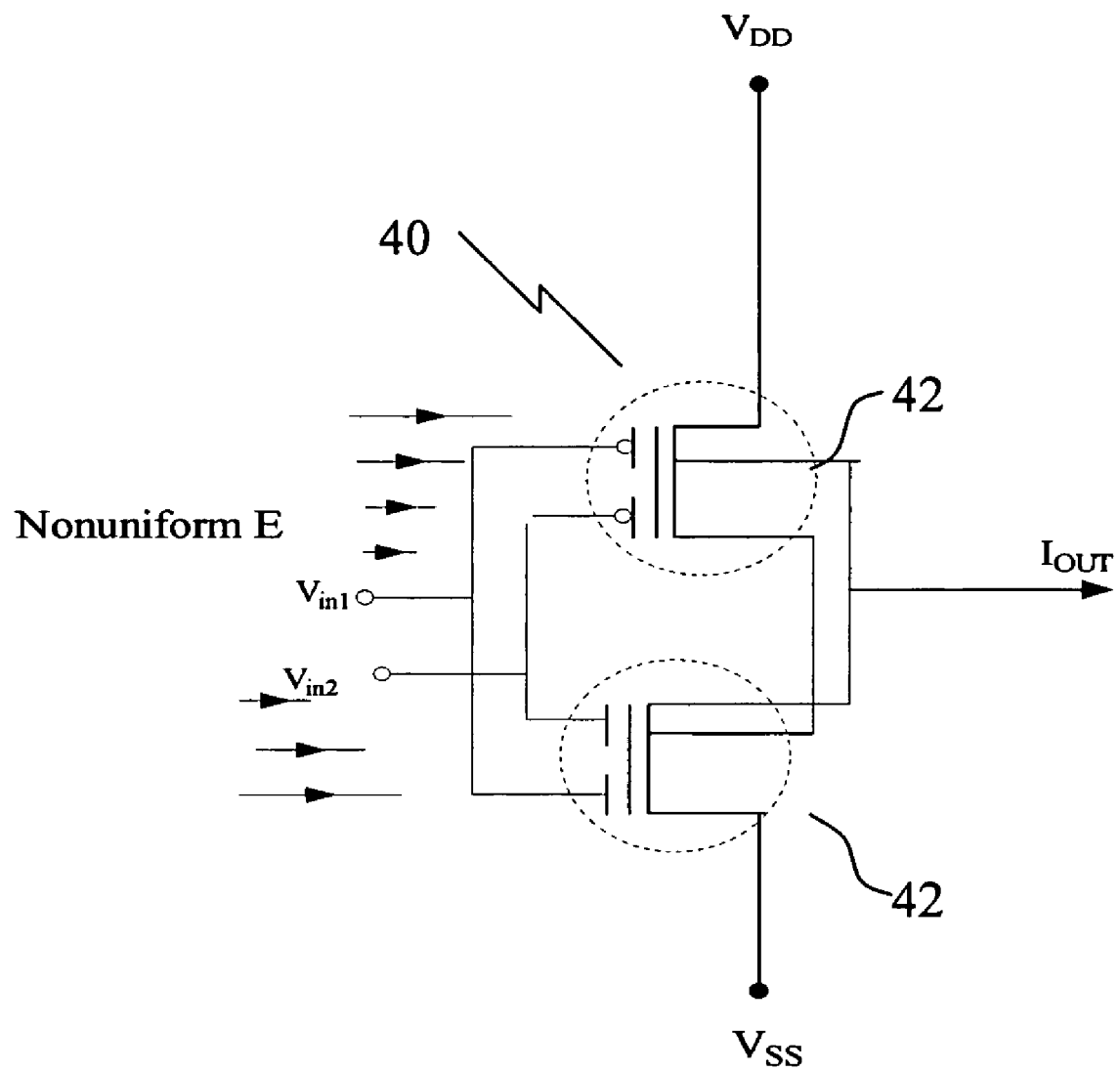
FIG. 8 is the circuit symbol of a DeFET.

The sensing unit 14 is composed of an array of the Differential Electric Field Sensitive MOSFET (DeFET) 40 shown in FIG. 8 acting as sensor elements 28 in FIG. 1b. DeFETs 40 allow us to record accurate information about the in-situ intensity of the applied nonuniform electric field. Referring to FIG. 1b, the sensor elements 28 are individually addressable through terminals 25 to read individual sensor values. As discussed above for the actuation unit 12, each sensor 28 may be actuated using electrical signals or a light beam, such as a laser. The sensors 28 are located in convenient locations around where the sample 26 will be processed by the actuation unit 12, such as in the space between the actuation electrodes 24 so that measurements around the characteristics of the sample 26 are recorded, and the intensity of the applied non-uniform electric field and force. More detail will now be given on the construction and operation of the DeFET 40.

The Electric Field Sensitive Field Effect Transistor (eFET)

Figure 5:
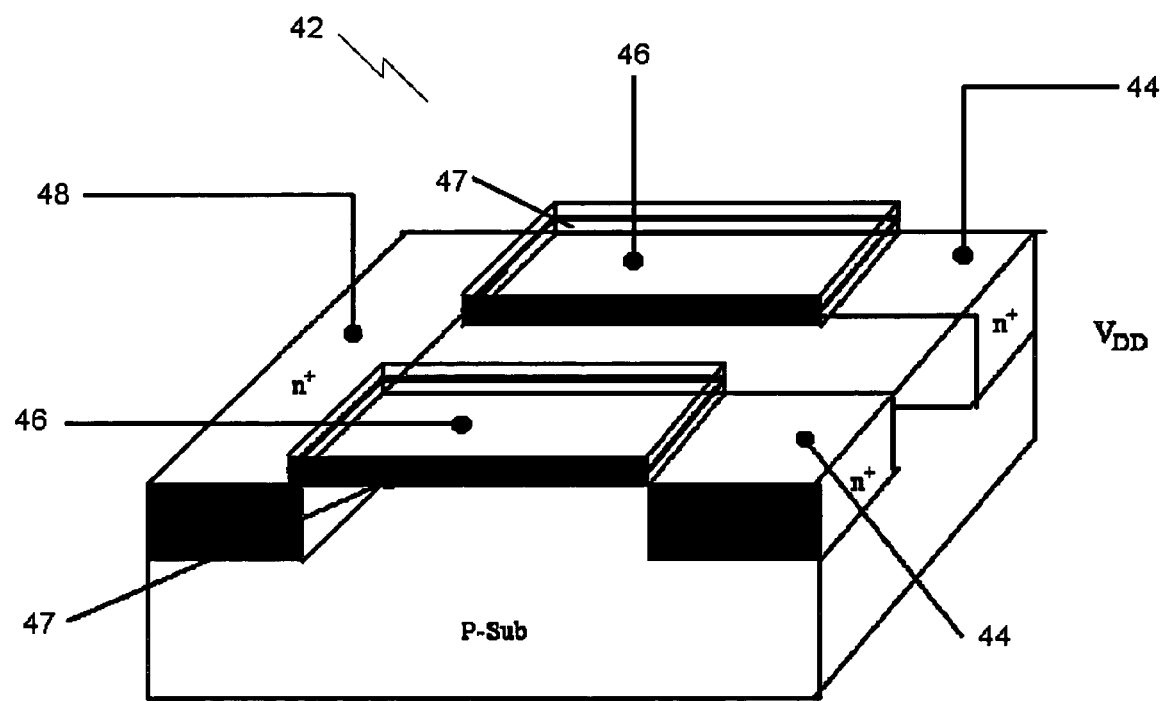
FIG. 5 is a perspective view of the physical structure of an eFET.
Figure 6:
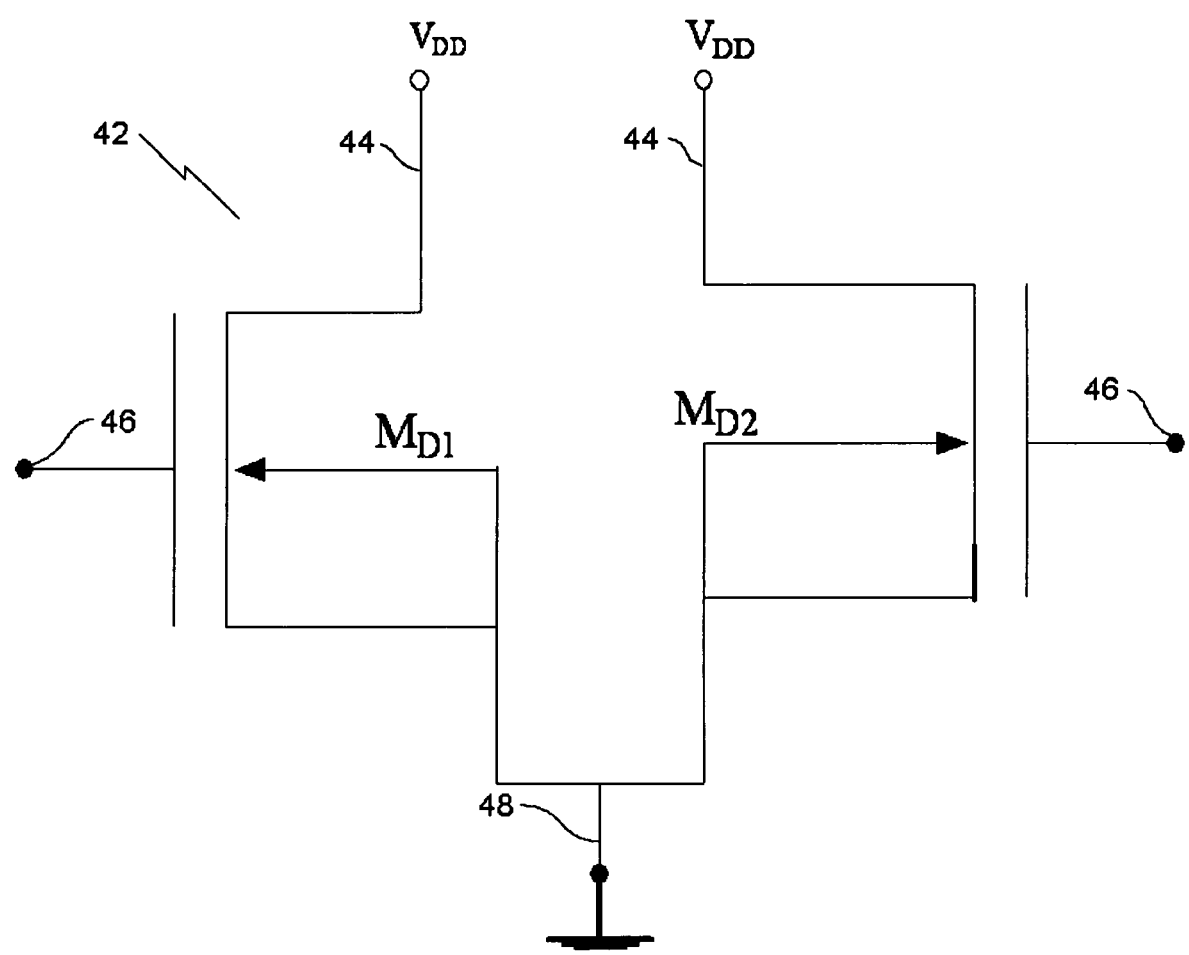
FIG. 6 is the circuit equivalent of an eFET.
Figure 7:
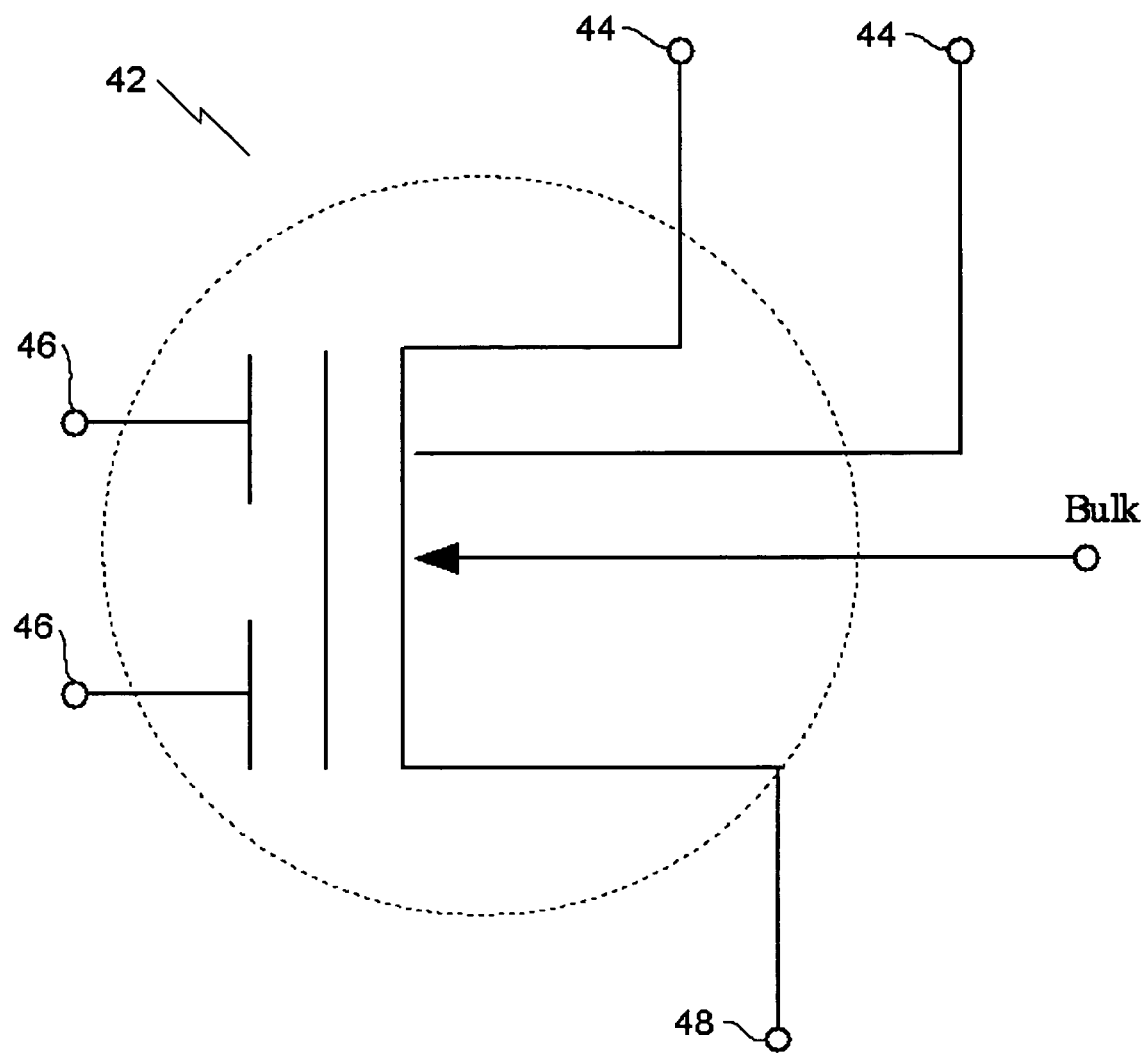
FIG. 7 is the circuit symbol for an eFET.

In the DEP levitation process, the manipulating electric field is a nonuniform electric field (i.e. the electric field is a function of the distance). Thus, we can detect the electric field by using the Electric Field Sensitive MOSFET (eFET) 42 shown in FIG. 5 as a novel electric field sensor. FIG. 5 shows the physical structure of the eFET 42. It has two adjacent drains 44, two adjacent floating gates 46 on silicon oxide ($SiO_2$) layers 47, and one source 48. For the eFET 42, it is equivalent to two identical enhancement MOSFET devices, as shown in FIG. 6. Thus, the two drain currents are equal if no electric field applied. Under the influence of a nonuniform electric field, a current imbalance between the two drain currents occur. Due to the drain current dependence on the gate voltage, the eFET device 42 that has two adjacent gates 46, and two adjacent drains 44, but isolated and spatially separated from each other, can sense the difference between the two gate voltages, which reflects the intensity of the applied nonuniform electric field between the two locations of the gates 46. FIG. 7 shows the circuit symbol of the eFET 42. To increase the dynamic range of the eFET 42, the CMOS concept is used to implement the DeFET 40 sensor, and this sensor may be used as the basic sensing block in the electric field imager. If only one side of the eFET were present (i.e. one gate 46, one drain, 44, and the source 48), the drain current would still be related to the electric field that is present, however, there would be nothing to compare the value with. This would be useful if a proper calibration technique was used. More accurate and meaningful results are therefore obtained using the eFET 42 as described, with a fixed distance between gates 46.

The Differential Electric Field Sensitive MOSFET (DeFET)

Figure 9:
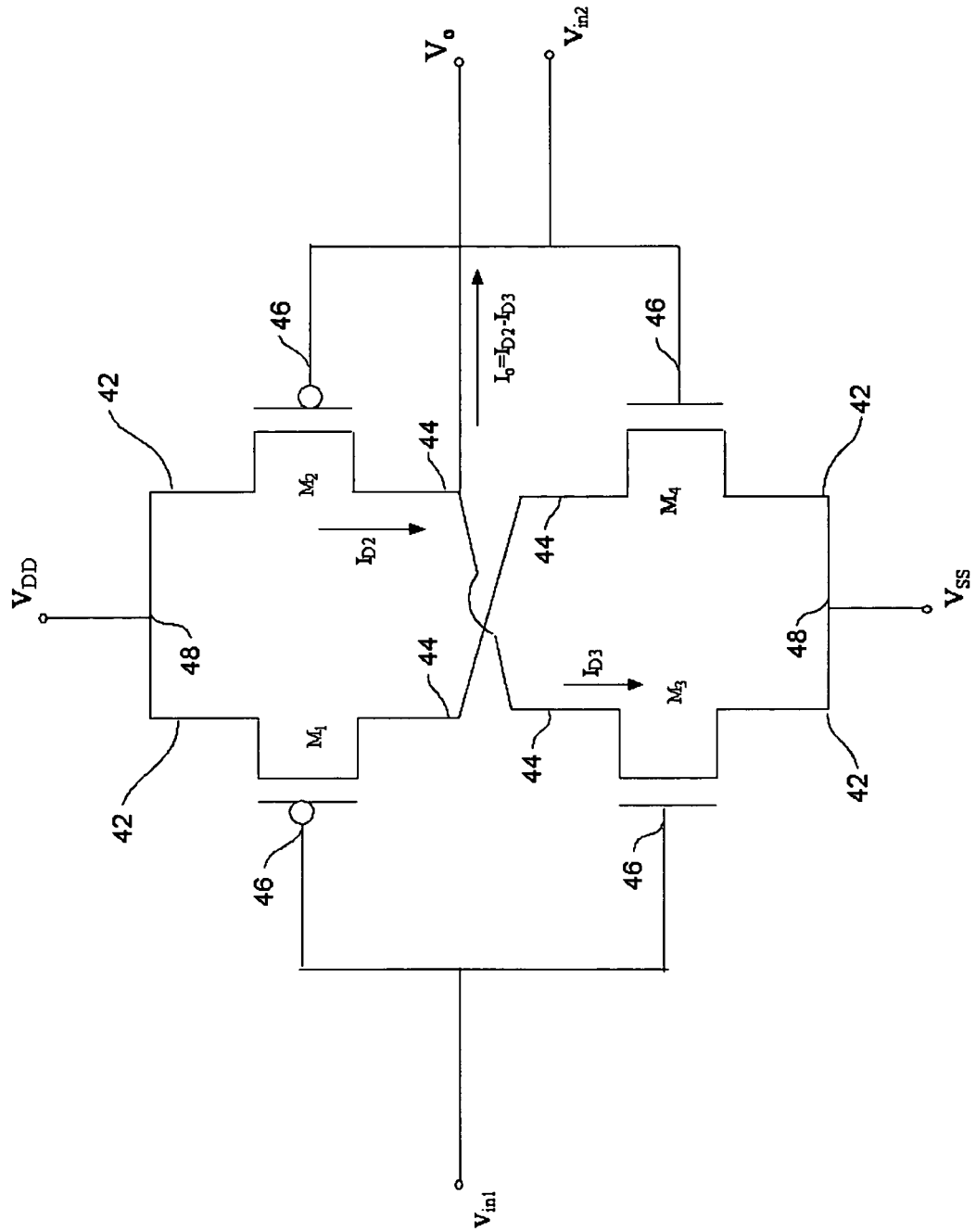
FIG. 9 is the circuit equivalent of a DeFET.

Referring to FIG. 8, the DeFET 40 is formed of two complementary eFETs 42, one of them is a p-type eFET 42 and the other is an n-type eFET 42. The equivalent circuit of the DeFET 40 is shown in FIG. 9. Referring to FIG. 9, the two gates 46 of the p-type eFET 42 and n-type eFET 42 are connected with each other, and there is a cross coupling between the two drains 44 of the p-type eFET 42 and the n-type eFET 42. The output current $I_O$ is equal to the difference between the two drain currents $I_{D2}-I_{D3}$ (i.e. $I_O=I_{D2}-I_{D3}$, see FIG. 9). On the other hand, $I_{D2}$ and $I_{D3}$ are functions of the two applied gate voltages $V_{in1}$ and $V_{in2}$, respectively, so, $I_O$ is directly related to the difference between the two applied gate voltages $(V_{in1}-V_{in2})$, and $V_{in1}-V_{in2}$ is equal to the applied electric field above the two gates 46 multiplied by the distance between them $(V_{in1}-V_{in2}/d=E)$, where d is the distance between the two split gates 46, which is constant. So, $I_O$ is related directly to the intensity of the applied nonuniform electric field. Thus by measuring $I_O$ we can detect the intensity of the nonuniform electric field.

The Read-out Circuit

Figure 10:
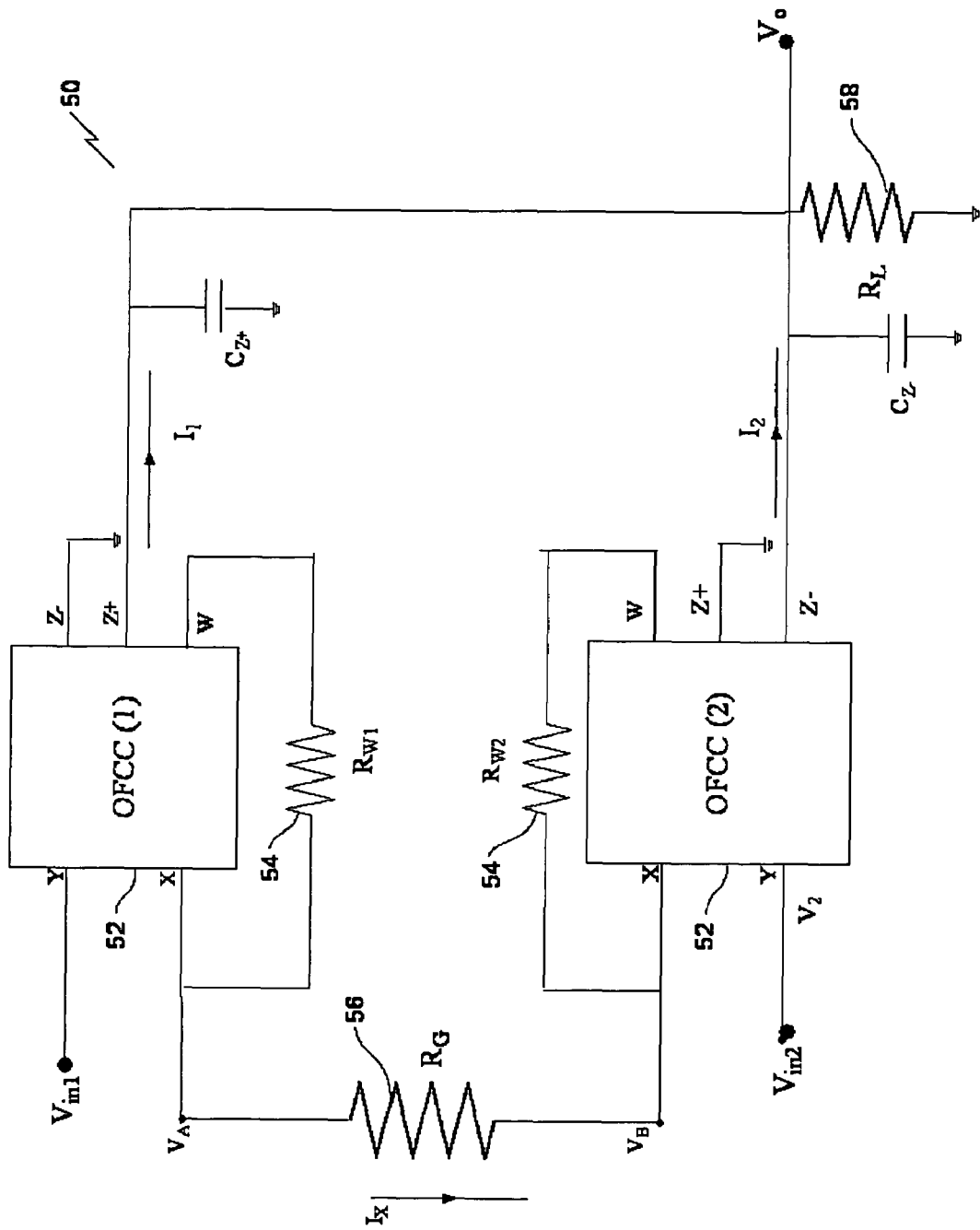
FIG. 10 is the Current-Mode Instrumentation Amplifier (CMIA) circuit used as a readout circuit.

For the read-out circuit 50, a higher differential gain is needed to amplify the small current signal at the output; also, it has to have a high common mode rejection ratio (CMRR) to reject any common mode signal. Referring to FIG. 10, a suitable read-out circuit 50 is the Current-Mode Instrumentation Amplifier (CMIA) proposed by Yehya H. Ghallab, Wael Badawy, Karan V.I.S. Kaler and Brent J. Maundy in "A Novel Current-Mode Instrumentation Amplifier Based on Operational Floating Current Conveyor", submitted to *IEEE Transaction in instrumentation and measurement*, (33 pages), January 2003. It is formed of two operational floating current conveyors (OFCC) 52, two feedback resistors ($R_{W1}$ and $R_{W2}$) 54, a gain determined resistor ($R_G$) 56 and a ground load ($R_L$) 58.

The Characterization Unit

The characterization unit 16 reads the output of the sensors 28 and develops a 2D image for the values and compares it with the actuated value. The difference between the actuation values and the sensed values are used to detect and characterize the levitated sample 26 and the characteristics of the contents and liquid inside the micro-channel which may be used as the chamber 18. The characterization unit 16 can also use a sequence of images and process them using image and video processing algorithms to identify the contents of the sample, algorithms such as edge detection, motion tracking, or DSP techniques.

The Controller

The controller 20 adjusts the value of the actuation unit 12 so it generates the required force. The controller 20 may adjust the actuation values using preprogrammed values, or it can read values from the sensing unit 14 or the characterization unit 16 to adjust the actuation unit 12 if needed.

Sensor-Actuation Integration

Figure 12:
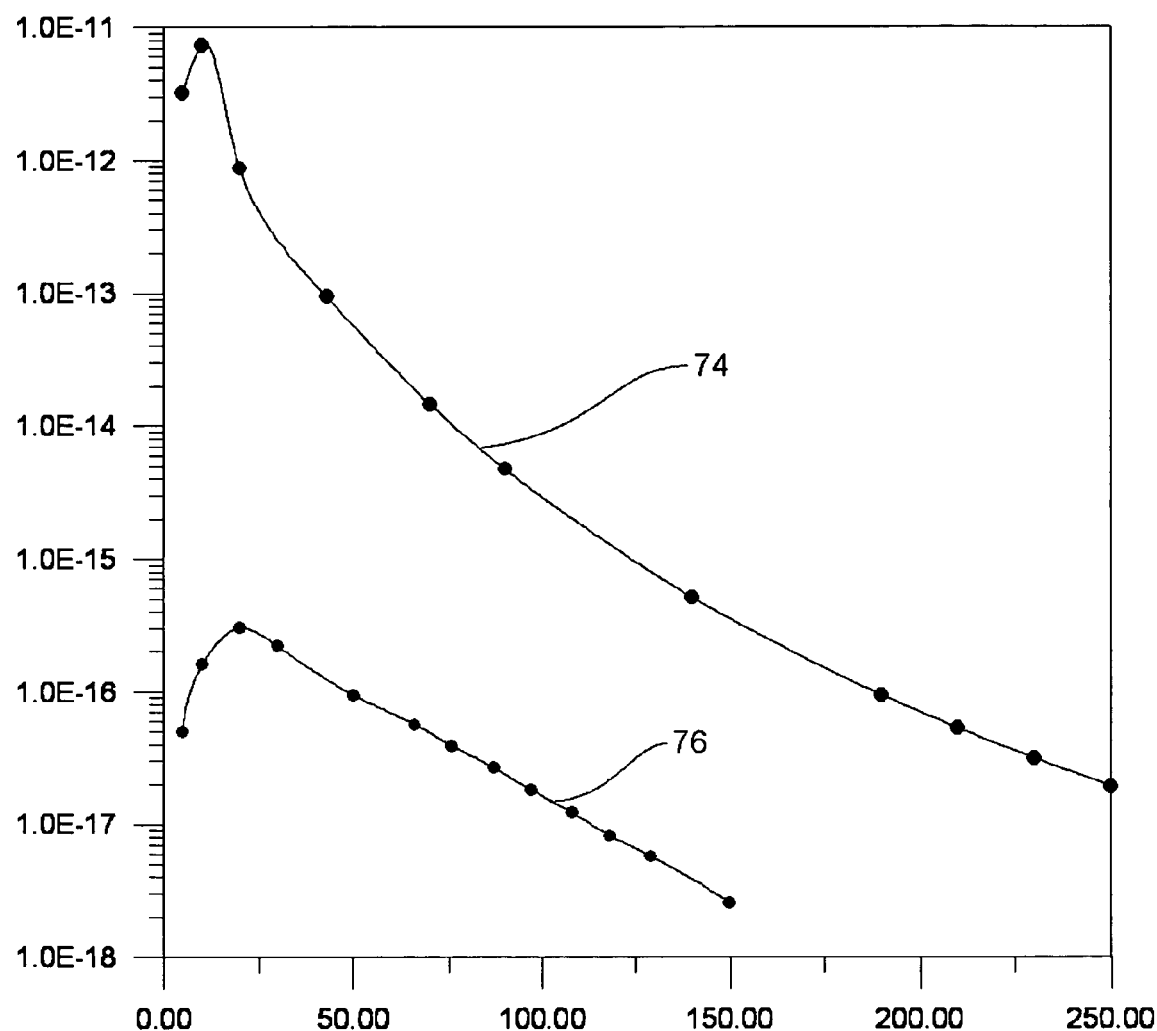
FIG. 12 is a graph displaying simulation results using Coulomb Software.

The integrated quadruple poles 24 with the sensing unit 14 is shown in FIG. 11*a*. It shows the quadrupole configuration to levitate the sample with the proposed electric field sensors 28 (DeFET 40) implanted in the middle. FIG. 12 shows the simulation results with the electric field sensors, represented by line 74 and without the electric field sensors, represented by line 76. From FIG. 12, we can observe that:

a) The Electric field sensors didn't disturb the profile of the electric field; alternatively, it improves the profile as we under a very small levitation height (Z=3 μm) the levitated particle is on the stable range of operation. In other words, the insertion of the DeFETs reduces the appearance of the unstable regime of operation, thus, we can easily levitate the cells can passively.

b) The z component of the dielectrophoertic force is increased, so we can levitate the heavy cells without any need of any other external forces, also, we can levitate the cell far from the electrodes, so many processes can be done (e.g. cell fusion, . . . etc . . . ).

Figure 13:
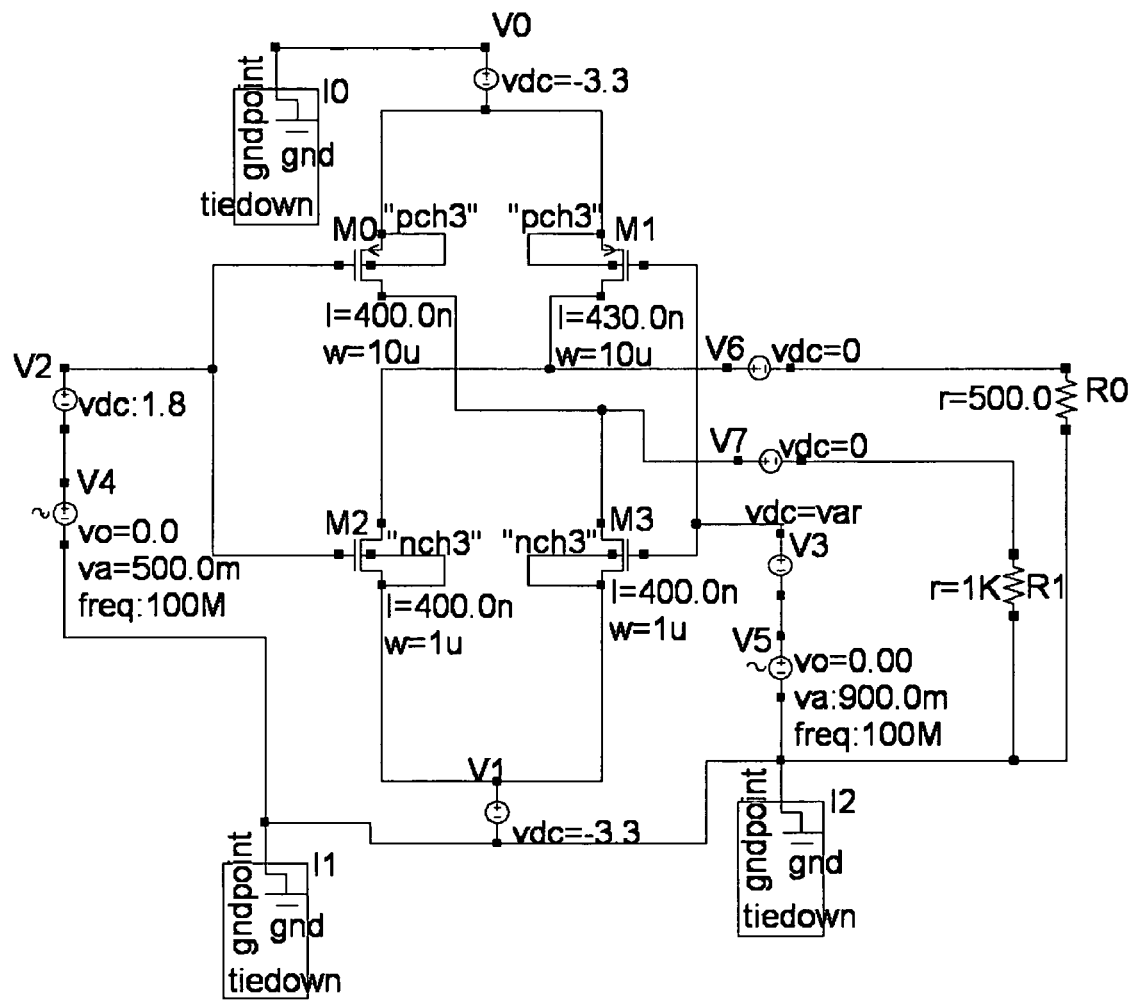
FIG. 13 is a schematic representation of a DeFET according to the invention.
Figure 14:
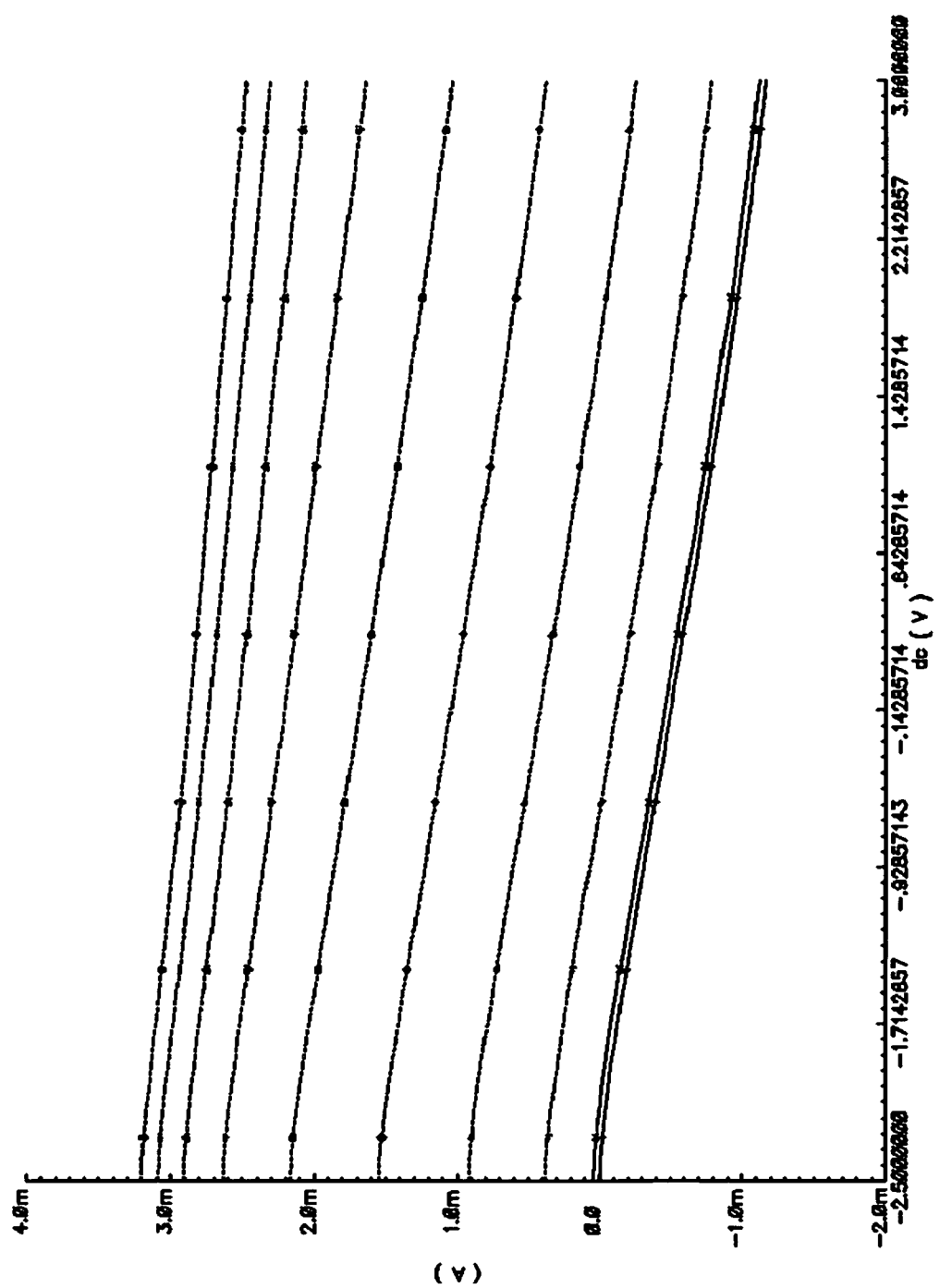
FIG. 14 is a graph showing simulation results using Cadence Simulator.

The sensing part (i.e. DeFET) is analyzed, designed, simulated, and implemented using Cadence analog design tool. The schematic representation of a single DeFET 40 is shown in FIG. 13, and the simulation results which confirm the functionality of the DeFET is shown in FIG. 14, where the different lines show different variations between the gates ranging from 3V (top line) to −3V (bottom line). From this figure, we can observe the linear relationship between the output current and the variation of the two gate voltages, which can reflect the variation with the applied electric field above the gates.

DeFET as an Impedance Sensor

Figure 17:
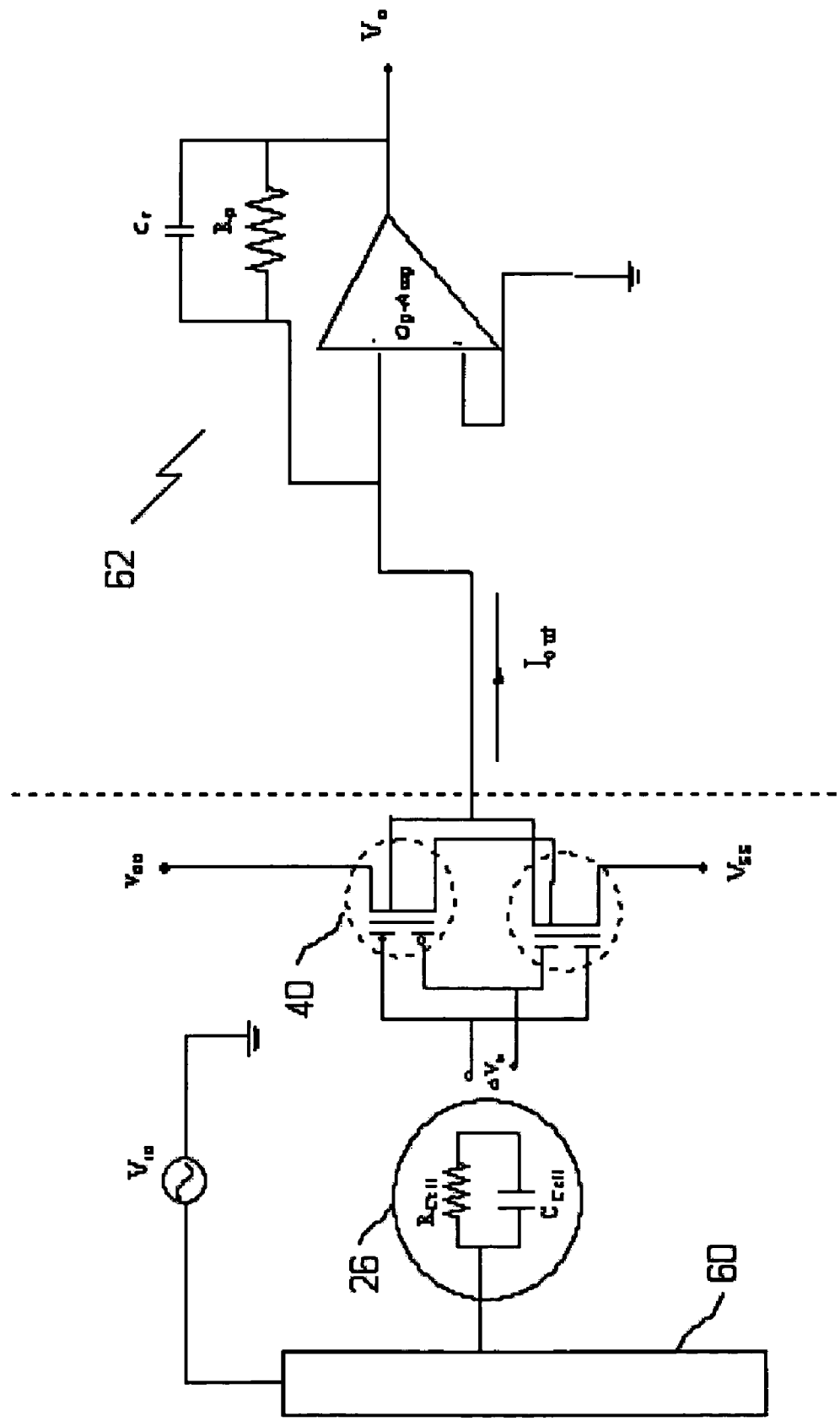
FIG. 17 is a schematic of a DeFET acting as an impedance sensor.

We can also use a DeFET 40 as an impedance sensor by using the technique shown in FIG. 17. In this figure, an excitation electrode 60 is used to trap the sample 26, in this case, a biocell, between it and the DeFET. The output current of the DeFET 40 is connected to a transimpedance amplifier 62 to convert the output current into voltage. In this technique, by measuring the output voltage, we can determine the impedance of the trapped biocell 26. The mathematical derivation is shown below.

Here we have a biocell 26 above the DeFET 40, so the output voltage ($V_{owcell}$) is related to $V_{in}$ by the equation:

$$V_{owcell} = \frac{V_{in}}{R_{sen} + (R_{cell} // C_{cell})}(R_F // C_F)$$

where $R_F$ is the feedback resistance, $C_F$ is the feedback capacitance, $R_{sen}$ is the output resistance of the DeFET 40, $R_{cell}$ is the biocell 26 resistance, and $C_{cell}$ is the biocell 26 capacitance. To get $R_{sen}$, we will determine the output voltage without the biocell 26, and the above equation will be:

$$V_o = \frac{V_{in}}{R_{sen}}(R_F // C_F)$$

From the above equation, we can get $R_{sen}$, so we can simply use this value in the first equation to get the impedance of the biocell (i.e. $R_{cell}//C_{cell}$).

Simulation

Figure 15:
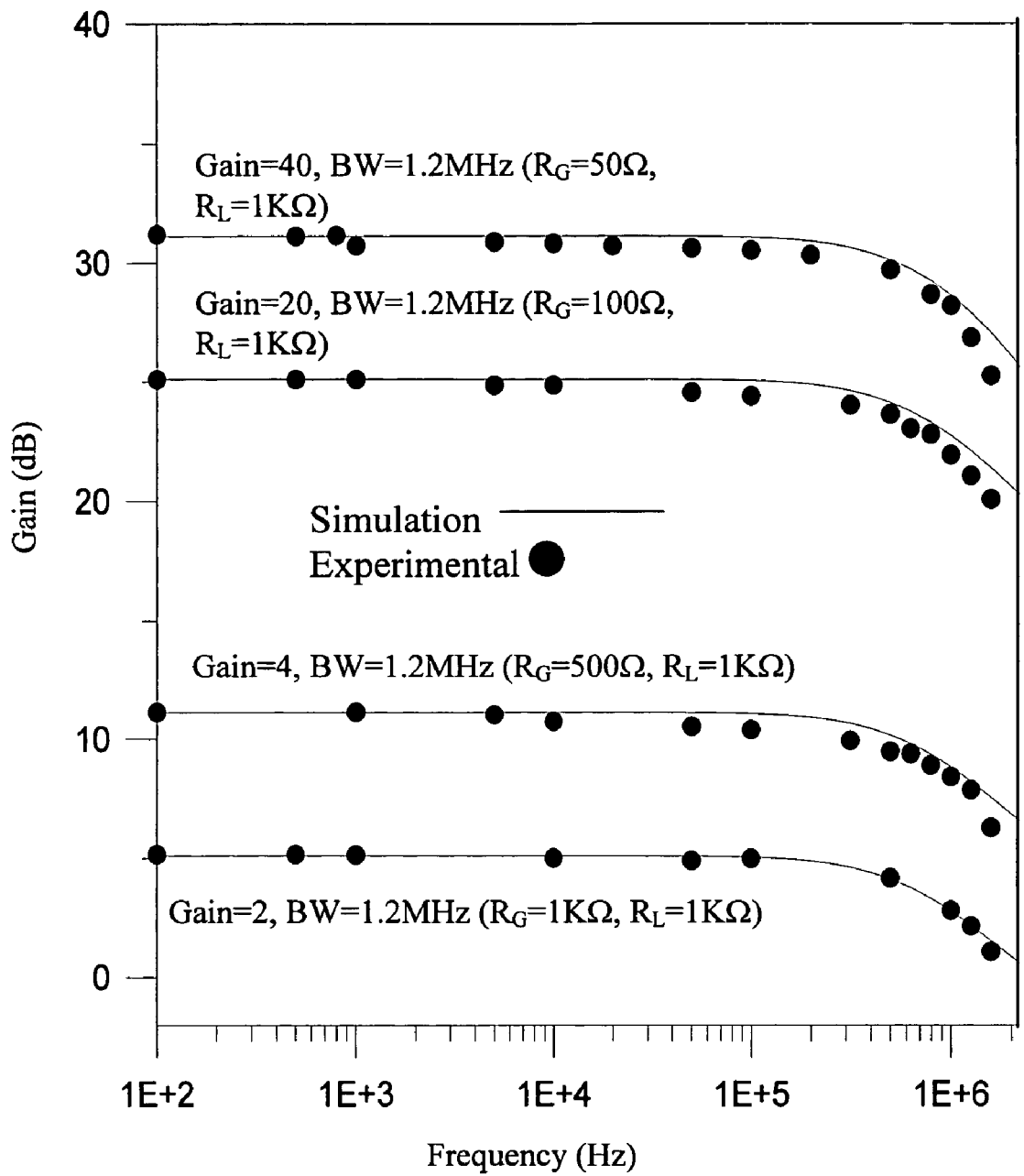
FIG. 15 is a graph showing the frequency response of the CMIA used in the simulation.
Figure 16:
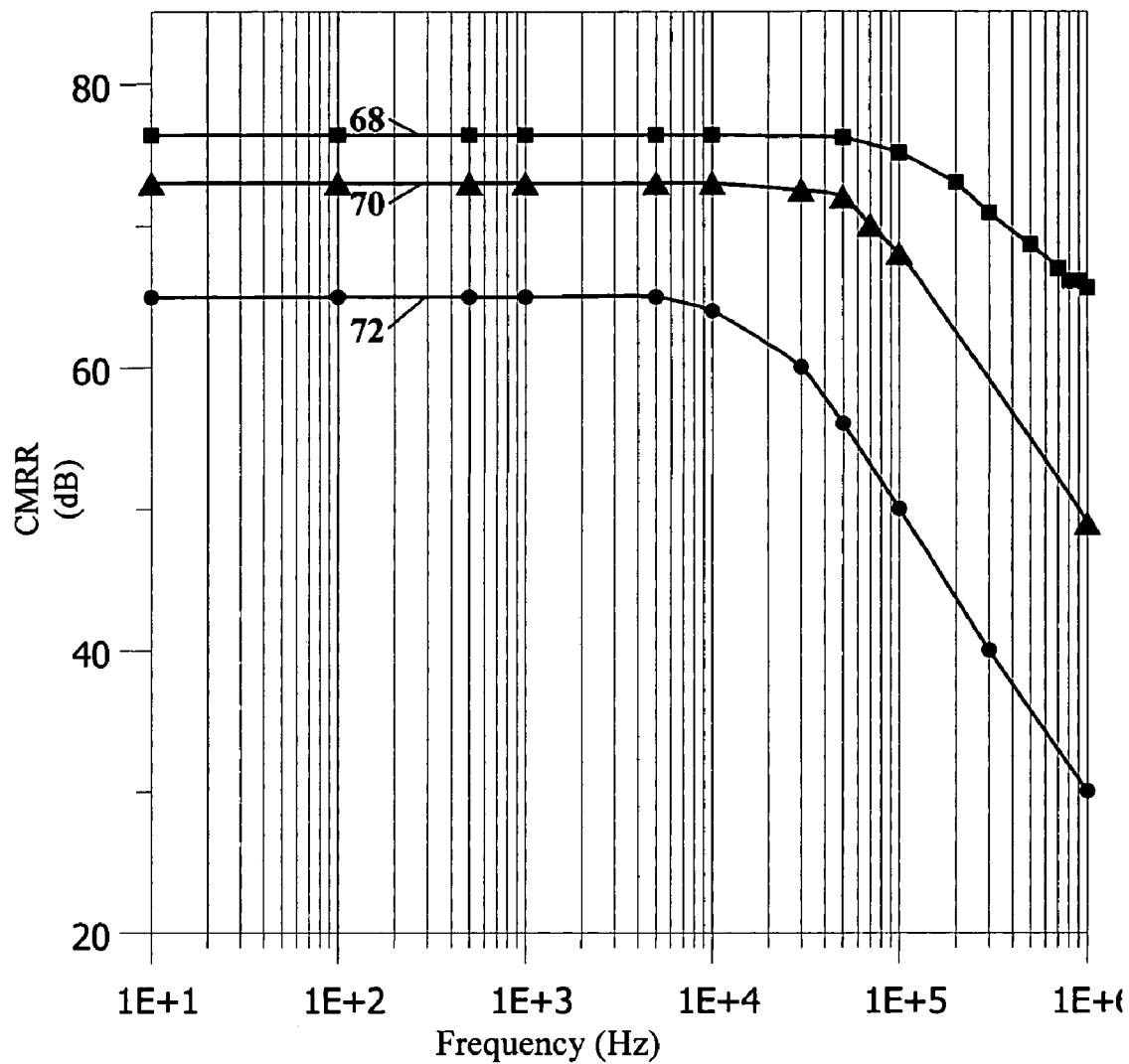
FIG. 16 is a graph showing the different common mode rejection ratio (CMRR) for different CMIA circuits.

To verify the operational characteristics of the proposed read out circuit 50, a simulation was developed using PSPICE version 7.1. Then, the proposed CMIA was prototyped and the simulation results were verified. The proposed current-mode instrumentation amplifier (CMIA) is shown in FIG. 10. It uses two OFCC 52. Each OFCC is constructed using a current feedback op amp 64 (such as serial no. AD846AQ,) and current-mirrors composed of transistor arrays 66 (such as a device from Harris, serial no. CA3096CE,). From FIG. 15, we can observe that the experimental results validate the simulated results, and by using external resistors, simply, we can control the gain. To measure the common-mode rejection ratio (CMRR) of the circuit in FIG. 10, we connected both $v_{in1}$ and $v_{in2}$ together to the same input voltage source. CMRR was measured experimentally as a function of frequency for a differential voltage gain of 20. The result obtained is plotted in FIG. 16. From FIG. 16, we can see that the proposed topology shows CMRR magnitude and bandwidth is ≈76 dB @185 KHz. In FIG. 16, a comparison between the proposed and the currently used CMIA is done. We can observe that the proposed CMIA circuit has higher CMRR as well a higher bandwidth associated with this CMRR as shown by line 68 than other topologies, where line 70 is from A. A. Khan, M. A. Al-Turaigi and M. Abou El-Ela, in "An Improved Current-mode Instrumentation Amplifier with Bandwidth Independent of gain," *IEEE Trans. Instr. Meas.*, vol. 44, no. 4, 1995, and line 72 is from B. Wilson in "Universal Conveyor Instrumentation Amplifier," *Elect. Let.*, vol. 25, no. 7, pp. 470-471, 1989 and S. J. G. Gift, in "An Enhanced Current-Mode Instrumentation Amplifier," *IEEE Trans. Instr. Meas.*, vol. 50, no. 1, pp. 85-88, 2001. So this CMIA is the best choice for our design.

Immaterial modifications may be made to the invention described here without departing from the invention. In the claims, the word "comprising" preceding a listing of claim elements does not exclude other elements being present in the method or apparatus referred to. In the claims, the use of the indefinite article preceding an element does not exclude more than one of the element being present.

We claim:

1. A detection apparatus for detecting the presence of a sample, the detection apparatus comprising:
   a chamber;
   a port for introducing a sample within the chamber;
   an actuation unit for establishing a controllable electromagnetic field in the chamber; and
   a FET sensing unit for sensing changes in the electromagnetic field due to the presence of the sample within the chamber, the FET sensing unit comprising a first sensor device comprising a source and a drain embedded in a first FET and a gate for the first FET, in which the gate is formed of a material whose conductivity is sensitive to the electromagnetic field established in a nonconductive medium in contact with the gate.

2. The detection apparatus of claim 1, wherein the controllable electromagnetic field is spatially non-uniform.

3. The detection apparatus of claim 1 wherein the first sensing device comprises two spatially separated gates and two spatially separated drains, with a common source.

4. The detection apparatus of claim 1 in which the first sensor device is connected to a second sensor device made of a second FET, the first FET being a p-type FET and the second FET being a n-type FET.

5. The detection apparatus of claim 1 wherein the sensing unit comprises an array of sensor devices.

6. The detection apparatus of claim 1 wherein the changes in the electromagnetic field sensed by the sensor device are used to determine the impedance of the sample.

7. The detection apparatus of claim 1 further comprising a characterization unit configured to use the changes sensed by the sensor unit to make a 2D image of the electromagnetic field.

8. The detection apparatus of claim 1 wherein the actuation unit comprises an array of electrodes.

9. The detection apparatus of claim 8 wherein the array of electrodes is arranged in a quadrupole arrangement.

10. The detection apparatus of claim 1, wherein the actuation unit comprises an array of electrodes and the sensing unit comprises an array of sensors interspersed with the array of electrodes.

11. The detection apparatus of claim 10, wherein at least one of the electrodes and sensors receive power from a electromagnetic source, wherein the electromagnetic energy is directed by mirrors controlled by the actuation unit.

12. The detection apparatus of claim 10, wherein the electrodes comprise a metal mesh.

13. The detection apparatus of claim 10, wherein the electrodes have metallic tips.

14. The detection apparatus of claim 10 wherein at least one of the electrodes and sensors receives power from a power source controlled by the actuation unit.

15. The detection apparatus of claim 14 wherein the electrodes are elongate members having a first end and a second end, the elongate members being connected to receive power at one of the first end and the second end and generate the electromagnetic field at the other of the first end and the second end in response to the power.

16. A detection apparatus for detecting the presence of a sample, the detection apparatus comprising:
   a chamber;
   a port for introducing a sample within the chamber;
   an actuation unit for establishing a controllable electromagnetic field in the chamber;
   a FET sensing unit for sensing changes in the electromagnetic field due to the presence of the sample within the chamber;
   the actuation unit comprising an array of electrodes and the sensing unit comprising an array of sensors interspersed with the array of electrodes; and
   at least one of the electrodes and sensors receiving electromagnetic energy from a electromagnetic source, wherein the electromagnetic energy is directed by mirrors controlled by the actuation unit.

17. The detection apparatus of claim 16, wherein the controllable electromagnetic field is spatially non-uniform.

18. The detection apparatus of claim 16, wherein the electrodes comprise a metal mesh.

19. The detection apparatus of claim 16, wherein the electrodes have metallic tips.

20. The detection apparatus of claim 16 wherein the changes in the electromagnetic field sensed by the sensor device are used to determine the impedance of the sample.

21. The detection apparatus of claim 16 further comprising a characterization unit that is configured to use the changes sensed by the sensor unit to make a 2D image of the electromagnetic field.

22. The detection apparatus of claim 16 wherein at least one of the electrodes and sensors receives power from a power source controlled by the actuation unit.

23. The detection apparatus of claim 22 wherein the electrodes are elongate members having a first end and a second end, the elongate members being connected to receive power at one of the first end and the second end and generate the electromagnetic field at the other of the first end and the second end in response to the power.

24. The detection apparatus of claim 16 wherein the actuation unit comprises an array of electrodes.

25. The detection apparatus of claim 24 wherein the array of electrodes is arranged in a quadrupole arrangement.

26. The detection apparatus of claim 16, wherein one or more sensors of the sensing unit each comprise a first sensor device comprising:

a source and a drain embedded in a first FET;

a gate for the first FET, in which the gate is formed of a material whose conductivity is sensitive to the electromagnetic field established in a nonconductive medium in contact with the gate.

27. The detection apparatus of claim 26 wherein each sensor device comprises two spatially separated gates and two spatially separated drains, with a common source.

28. The detection apparatus of claim 26 wherein in which the first sensor device is connected to a second sensor device made of a second FET, the first FET being a p-type FET and the second FET being a n-type FET.

* * * * *